United States Patent [19]
Ikegami

[11] Patent Number: 5,973,384
[45] Date of Patent: Oct. 26, 1999

[54] SEMICONDUCTOR DEVICE INCLUDING A BIPOLAR TRANSISTOR

[75] Inventor: Masaaki Ikegami, Hyogo, Japan

[73] Assignee: Mitsubishi Denki Kabushiki Kaisha, Tokyo, Japan

[21] Appl. No.: 08/190,388

[22] Filed: Feb. 2, 1994

[30] Foreign Application Priority Data

Mar. 19, 1993 [JP] Japan ................................ 5-060370

[51] Int. Cl.$^6$ ..................... H01L 27/082; H01L 27/102
[52] U.S. Cl. ............................. 257/588; 257/592
[58] Field of Search ................... 257/565, 592, 257/591, 593, 587, 588, 761, 763, 765, 575, 576

[56] References Cited

U.S. PATENT DOCUMENTS

| | | | |
|---|---|---|---|
| 4,752,817 | 6/1988 | Lechaton et al. | 257/592 |
| 4,980,738 | 12/1990 | Welch et al. | 257/588 |
| 5,091,321 | 2/1992 | Huie et al. | 437/15 |

FOREIGN PATENT DOCUMENTS

| | | |
|---|---|---|
| 2-79436 | 3/1990 | Japan . |
| 3-126254 | 5/1991 | Japan . |

OTHER PUBLICATIONS

H. Murrmann, "Modern Bipolar Technology for High–Performance ICs", Siemens Forsch.–u. Entwickl.–Ber. Bd. 5 (1976) Nr. 6, Springer–Verlag 1976, pp. 353–359.

R. L. Cuttino et al., "Power Transistor for Rectifier/Regulator Applications", IBM Technical Disclosure Bulletin, vol. 22, No. 5, Oct. 1979, pp. 2016 and 2017.

S. F. Chu et al., "Process for Fabricating Polysilicon Base Bipolar Transistor", vol. 25, No. 7B, Dec. 1982, pp. 4016–4018.

*Primary Examiner*—Wael M. Fahmy
*Attorney, Agent, or Firm*—McDermott, Will & Emery

[57] ABSTRACT

A semiconductor device in which stable and low resistance ohmic contact can be obtained in a base contact region without decreasing the emitter-base reverse breakdown voltage and the current amplification factor is disclosed. In this semiconductor device, $p^{++}$-type base contact layer 8 having an impurity concentration higher than that of $p^+$-type base layer 5 is formed in a region spaced apart by a predetermined distance from $n^+$-type emitter layer 7 on the main surface of $p^+$-type base layer 5. Thus, $p^{++}$-type base contact layer 8 having a high concentration does not contact $n^+$-type emitter layer 7, and also the current amplification factor and the emitter-base breakdown voltage are not decreased. Since $p^{++}$-type base contact layer 8 is formed so as to have a diffusion depth shallower than that of $n^+$-type emitter layer 7, the lateral spread of $p^{++}$-type base contact layer 8 can be reduced. Therefore, the side of $p^{++}$-type base contact layer 8 having a high concentration can be effectively prevented from contacting the side of $n^+$-type emitter layer 7 even when the elements are made smaller.

9 Claims, 20 Drawing Sheets

SEMICONDUCTOR DEVICE INCLUDING A BIPOLAR TRANSISTOR

BACKGROUND OF THE INVENTION

1. Field of the Invention

The present invention relates to semiconductor devices and a manufacturing method thereof, and more particularly, to a semiconductor device having a bipolar transistor and a manufacturing method thereof.

2. Description of the Background Art

Conventionally, a bipolar transistor is known as one of semiconductor elements. FIG. 22 is a cross section of a semiconductor device including a conventional bipolar transistor. Referring to FIG. 22, a conventional semiconductor device having a bipolar transistor includes a $p^+$-type silicon substrate 101; an $n^+$-type buried diffusion layer 102 which is formed in a predetermined region on a main surface of $p^+$-type silicon substrate 101; an $n^-$-type epitaxial layer 103 which is formed on the entire main surface of $p^+$-type silicon substrate 101; a $p^+$-type isolation layer 104 which is formed in a predetermined region of $n^-$-type epitaxial layer 103; an $n^+$-type collector layer 106 which is formed in a predetermined region on a main surface of $n^-$-type epitaxial layer 103 surrounded by $p^+$-type isolation layer 104; a $p^+$-type base layer 105 which is formed in a region on the main surface of $n^-$-type epitaxial layer 103 spaced apart by a predetermined distance from $n^+$-type collector layer 106; and an $n^+$-type emitter layer 107 which is formed in a predetermined region on a main surface of $p^+$-type base layer 105.

Also, a conventional semiconductor device having a bipolar transistor includes an insulating oxide film 109 which is formed on the main surface of $n^-$-type epitaxial layer 103 and having contact holes 109a, 109b, and 109c formed respectively on $n^+$-type emitter layer 107, $p^+$-type base layer 105, and $n^+$-type collector layer 106; titanium silicide ($TiSi_2$) films 110a, 110b, and 110c which are formed to contact the surface of $n^+$-type emitter layer 107, $p^+$-type base layer 105, and $n^+$-type collector layer 106 respectively in contact holes 109a, 109b, and 109c; titanium nitride (TiN) films 111a, 111b, and 111c which are formed respectively on titanium silicide films 110a, 110b, and 110c; aluminum interconnection films 112a, 112b, and 112c which are formed respectively on titanium nitride films 111a, 111b, and 111c; and a protection film 113 which is formed to cover the entire surface.

Titanium silicide films 110a, 110b, and 110c are formed to make ohmic contact with $n^+$-type emitter layer 107, $p^+$-type base layer 105 and $n^+$-type collector layer 106 respectively. Titanium nitride films 111a, 111b, and 111c serve as barrier layers for preventing aluminum alloy spike caused by aluminum interconnection layers 112a, 112b, and 112c formed thereon. A collector region is structured by $n^-$-type epitaxial layer 103 and $n^+$ collector layer 106 in a region surrounded by $p^+$-type isolation layer 104.

FIGS. 23–31 are cross sectional views showing a manufacturing process of a semiconductor device including a conventional bipolar transistor shown in FIG. 22. Referring to FIGS. 23–31, a manufacturing process of a conventional semiconductor device will be described.

As shown in FIG. 23, $n^+$-type buried diffusion layer 102 is formed in $p^+$-type silicon substrate 101. Then, $n^-$-type epitaxial layer 103 is formed on the entire surface of $p^+$-type silicon substrate 101. $p^+$-type isolation layer 104 is formed in a predetermined region of $n^-$-type epitaxial layer 103. Insulating oxide film 109 is formed on a main surface of $n^-$-type epitaxial layer 103.

As shown in FIG. 24, p-type impurity is introduced via insulating oxide film 109 into a predetermined region on the main surface of $n^-$-type epitaxial layer 103 surrounded by $p^+$-type isolation layer 104 through, for example, the ion implantation method. Then, $p^+$-type base layer 105 having resistance value of 100–1000 $\Omega/\square$, diffusion depth of 0.3–1.5 $\mu m$, and surface impurity concentration of about $-5 \times 10^{18}$ cm$^{-3}$ is formed by activating the introduced p-type impurity.

As shown in FIG. 25, a photoresist 120 is formed by using photolithography in a predetermined region on insulating oxide film 109. Using photoresist 120 as a mask, insulating oxide film 109, where an emitter electrode, a base electrode and a collector electrode of the bipolar transistor are to be made, is etched anisotropically, and thereby contact holes 109a, 109b, and 109c are formed. Photoresist 120 is then removed.

As shown in FIG. 26, a photoresist 121 is formed by using photolithography so as to cover the region, where the base electrode of the bipolar transistor is to be made, is formed. Then, n-type impurity such as arsenic ions ($As^+$) is implanted on the entire surface. Photoresist 121 is then removed. Then, $n^+$-type collector layer 106 and $n^+$-type emitter layer 107 are formed as shown in FIG. 27 by activating the ion-implanted impurity.

As shown in FIG. 28, titanium (Ti) film 122 having a thickness of the range from about 40 to about 100 nm is formed. Then heat treatment is conducted for about 30 seconds in $N_2$ atmosphere under the temperature condition of 750–850° C. Thereby, titanium silicide films 110a, 110b, and 110c and titanium nitride layer 111 are formed as shown in FIG. 29. More particularly, titanium silicide films 110a, 110b, and 110c are formed by silicide reaction between titanium film 122 (see FIG. 28) and silicon in $n^-$-type epitaxial layer 103, while the rest of titanium film 122 (see FIG. 28) is nitrided by $N_2$ gas to be titanium nitride layer 111.

As shown in FIG. 30, aluminum interconnection layer 112 is formed on titanium nitride layer 111. A photoresist 123 is formed by photolithography at a predetermined region on aluminum interconnection layer 112. Using photoresist 123 as a mask, titanium nitride films 111a, 111b, and 111c and aluminum interconnection films 112a, 112b, and 112c are formed as shown in FIG. 31 by etching aluminum interconnection layer 112 and titanium nitride layer 111 anisotropically. Resist 123 is then removed.

Finally, as shown in FIG. 32, protection film 113 is formed on the entire surface. The conventional semiconductor device having a bipolar transistor is thus completed.

As mentioned above, in the conventional semiconductor device having a bipolar transistor, titanium silicide films 110a, 110b, and 110c are formed by utilizing silicide reaction between titanium layer 122 and substrate silicon so as to obtain ohmic contact with $n^+$-type emitter layer 107, $p^+$-type base layer 105, and $n^+$-type collector layer 106.

However, p-type impurity in $p^+$-type base layer 105 is taken in titanium silicide film 110b due to silicide reaction between titanium and silicon. FIG. 33 is an impurity profile along line $X_1$—$X_1$ in a step before silicide reaction shown in FIG. 28. FIG. 34 is an impurity profile along line $X_2$—$X_2$ in a step after silicide reaction shown in FIG. 29. Referring to FIGS. 33 and 34, the surface impurity concentration in $p^+$-type base layer 105 is about $5 \times 10^8$ cm$^{-3}$ before silicide reaction: however, it is noted that the surface impurity concentration in p$^+$-type base layer 105 is lowered to about 5×10$^{16}$ cm$^{-3}$ after silicide reaction. This is because p-type impurity in p$^+$-type base layer 105 is taken in titanium silicide (TiSi$_2$) film 110b which is formed by silicide reaction, as shown in FIG. 34.

FIG. 35 is an impurity profile along line A$_1$—A$_1$ in the semiconductor device which is completed finally as shown in FIG. 32, and FIG. 36 is an impurity profile along line B$_1$—B$_1$ of the same. Referring to FIG. 35, in the impurity profile along line A$_1$—A$_1$ of the finished semiconductor device (see FIG. 32), the impurity concentration in p$^+$-type base layer 105 is lowered down to 5×10$^{16}$ cm$^{-3}$ by silicide reaction as described above. Here, as shown in FIG. 36, the impurity concentration in n$^+$-type emitter layer 107 (see FIG. 32) is not lowered so much by silicide reaction as p$^+$-type base layer 105. This is because n-type impurity is hardly taken in silicide layer generally, and at the same time the impurity concentration in n$^+$-type emitter layer 107 was originally high. Accordingly, the impurity concentration in n$^+$-type collector layer 106, which is the same n-type as the emitter layer 107, is not so much lowered by silicide reaction. Thus, only p$^+$-type base layer 105 is affected by silicide reaction, and, the problem is the decrease of the impurity concentration in p$^+$-type base layer 105.

More particularly, the resistance of the base contact increases if the surface impurity concentration of p$^+$-type base layer 105 decreases due to silicide reaction. FIG. 37 is a graph showing correlation of the impurity concentration at interface between titanium silicide (TiSi$_2$) and silicon (Si) and the resistance value of the base contact. Referring to FIG. 37, it is noted that if the impurity concentration at interface between titanium silicide and silicon, i.e., the surface impurity concentration in p$^+$-type base layer 105, decreases, then the resistance value of the base contact increases abruptly. More specifically, after silicide reaction the resistance value of the base contact increases up to about 1000 times that before silicide reaction. Hence, the problem was that the operating speed of the bipolar transistor decreased if the resistance value of the base contact increased.

Also, the base contact resistance comes to depend on temperature as the surface impurity concentration in p$^+$-type base layer 105 decreases due to silicide reaction. FIG. 38 is a graph showing a relationship of the temperature when the surface impurity concentration N in p$^+$-type base layer 105 is not more than 1.0×10$^{17}$ cm$^{-3}$ and of the resistance value of the base contact. Referring to FIG. 38, a remarkable temperature dependency is developed in the resistance of the base contact when the surface impurity concentration N of p$^+$-type base layer 105 is lowered to 1.0×10$^{17}$ cm$^{-3}$ or lower. In other words, the resistance of the base contact decreases as the temperature rises. This phenomenon becomes outstanding as the current decreases. This phenomenon is disclosed, for example, in *VLSI TECHNOLOGY* edited by S. M. Sze, pp. 347–350. Thus, as the temperature dependency is developed in the resistance of the base contact, the circuit characteristics change because of temperature.

Conventionally, the resistance of the base contact increases because the surface impurity concentration in p$^+$-type base layer decreases by silicide reaction, causing much temperature dependency of the resistance of the base contact. In addition to silicide reaction, conventionally, oxidization of the surface of p$^+$-type base layer or the like causes decrease of the surface impurity concentration of p$^+$-type base layer.

The following is a possible structure in order to solve such problems. FIG. 39 is a cross sectional view showing the proposed example. Referring to FIG. 39, a p$^{++}$-type base layer 205 which has a higher impurity concentration compared to the conventional one is applied in this proposal. If p$^{++}$-type base layer 205 of a higher impurity concentration is formed, even though the surface impurity concentration in p$^{++}$-type base layer 205 is decreased by silicide reaction, etc., the decrease of surface impurity concentration to 10$^8$ cm$^{-3}$ or lower can be easily prevented. Accordingly, problems such as increase of the resistance of the base contact and occurrence of temperature dependency of the resistance of the base contact can be solved.

However, when p$^{++}$-type base layer 205 which has a higher impurity concentration is formed, the difference of impurity concentrations at interface between p$^{++}$-type base layer 205 and emitter layer 107 is increased. Thus, it becomes difficult for electrons from n$^+$-type emitter layer 107 to pass through p$^{++}$-type base layer 205, and accordingly an amplification factor between an emitter and base is decreased. Also, if the difference of impurity concentrations at interface between p$^{++}$-type base layer 205 and n$^+$-type emitter layer 107 becomes large, it leads to electric field concentration, so that the emitter-base reverse breakdown voltage of is decreased. Thus, when p$^{++}$-type base layer 205 having a higher impurity concentration is used for preventing decrease of the surface impurity concentration in the base layer due to silicide reaction, etc., various problems will occur.

SUMMARY OF THE INVENTION

An object of the present invention is to effectively prevent decrease of the surface impurity concentration in the base layer due to silicide reaction without causing other problems in a semiconductor device.

Another object of the present invention is to effectively prevent increase of the resistance of the base contact and development of temperature dependency of the base contact resistance due to silicide reaction without causing decrease of current amplification factor and of breakdown voltage in a semiconductor device.

Still another object of the present invention is to easily manufacture a semiconductor device which can effectively prevent increase of the resistance of the base contact and development of temperature dependency of the base contact resistance without causing other problems in a manufacturing method of the semiconductor device.

According to one aspect of the present invention, the semiconductor device includes a first conductivity-type collector impurity region; a second conductivity-type base impurity region which is formed in a predetermined region on a main surface of the collector impurity region and has a first impurity concentration; a first conductivity-type emitter impurity region which is formed in a predetermined region on a main surface of the base impurity region and has a first depth; and a second conductivity-type base contact impurity region which is formed on a main surface of the base impurity region spaced by a predetermined distance from the emitter impurity region and has a second impurity concentration higher than the first impurity concentration and a second depth shallower than the first depth.

The second conductivity-type base contact impurity region having the second impurity concentration higher than the first impurity concentration is formed on the main surface of the second conductivity-type base impurity region having the first impurity concentration. Thus, even if the impurity in the base contact impurity region is taken in the metal silicide layer by silicide reaction during formation of the metal silicide layer on the base contact impurity region for decreasing the surface impurity concentration in the base contact impurity region, increase of the resistance of the base contact will be reduced more effectively than before. Also, the side of the base contact impurity region of a higher concentration and the side of the emitter impurity region are not in contact with each other, since the base contact impurity region is formed spaced apart by a predetermined distance from the emitter impurity region. Inconvenience such as decrease of the emitter-base inverse breakdown voltage caused when the base contact impurity region of a higher concentration touches the emitter impurity region will be effectively prevented. Further, lateral spread of the base contact impurity region is reduced because the base contact impurity region is formed to have the second depth which is shallower than the first depth of the emitter impurity region, so that contact of the side of the base contact impurity region of a higher concentration and the side of the emitter impurity region can be prevented even when elements are made smaller. Accordingly, in-convenience such as decrease of the emitter-base reverse breakdown voltage caused by the contact of the side of the base contact impurity region of a higher concentration with the side of the emitter impurity region can be effectively prevented even if elements are made smaller.

In another aspect of the present invention, a semiconductor device includes a first conductivity-type collector impurity region; a second conductivity-type base impurity region which is formed in a predetermined region on a main surface of the collector impurity region and has a first impurity concentration; a first conductivity-type emitter impurity region which is formed in a predetermined region on a main surface of the base impurity region; a second conductivity-type base contact impurity region which is formed on the main surface of the base impurity region spaced by a predetermined interval impurity region and has a second impurity concentration higher than the first impurity concentration; and a metal silicide layer which is formed at least on the base contact impurity region.

In the semiconductor device, the second conductivity-type base contact impurity region having the second impurity concentration higher than the first impurity concentration is formed on the main surface of the second conductivity-type base impurity region having the first impurity concentration, and the metal silicide layer is formed on the base contact impurity region. Thus, even if the impurity in the base contact impurity region is taken in the metal silicide layer by silicide reaction by formation of the metal silicide layer so that the surface impurity concentration of the base contact impurity region is decreased, the increase of the resistance of the base contact will be prevented more effectively than before. Also, since the base contact impurity region is formed spaced apart by a predetermined interval from the emitter impurity region, the side of the base contract impurity region of a higher concentration will not be in contact with the side of the emitter impurity region. Accordingly, inconvenience such as decrease of the emitter-base inverse breakdown voltage caused when the base contact impurity region of a higher concentration is in contact with the emitter impurity region.

In still another aspect of the present invention, a method of manufacturing a semiconductor device includes the steps of forming the first conductivity-type collector impurity region; forming the second conductivity-type base impurity region having the first impurity concentration in a predetermined region on the main surface of the collector impurity region; forming the first conductivity-type emitter impurity region having the first depth in a predetermined region on the main surface of the base impurity region; and forming the base contact impurity region having the second impurity concentration higher than the first impurity concentration and the second depth shallower than the first depth by introducing the second conductivity-type impurity into a region spaced apart by a predetermined distance from the emitter impurity region on the main surface of the base impurity region.

The base contact impurity region having the second impurity concentration higher than the first impurity concentration is formed by introducing the second conductivity-type impurity onto the main surface of the base impurity region having the first impurity concentration. Thus, even if the impurity in the base contact impurity region is taken in the metal silicide layer by formation of the silicide of the metal layer on the base contact impurity region so that the surface impurity concentration of the base contact impurity region is decreased, the increase of the resistance of the base contact will be prevented more effectively than before since the base contact impurity region is formed to have a high concentration originally. Also, because the base contact impurity region is formed spaced apart by a predetermined interval from the emitter impurity region, the side of the base contact impurity region of a higher concentration will not be in contact with the side of the emitter impurity region. Accordingly, inconvenience such as decrease of the emitter-base inverse breakdown voltage caused when the side of the base contact impurity region of a higher concentration and the side of the emitter impurity region are in contact with each other will be prevented effectively. Also, because the base contact impurity region is formed so as to have the second depth shallower than the first depth of the emitter impurity region, lateral spread of the base contact impurity region can be reduced, so that the base contact impurity region of a higher concentration does not touch the side of the emitter impurity region even when elements are made smaller. Thus, various inconveniences such as the decrease of the emitter-base inverse breakdown voltage caused by the contact of the base contact impurity region of a higher concentration with the emitter impurity region will be prevented even when elements are made smaller.

In still another aspect of the present invention, the method of manufacturing the semiconductor device includes the steps of forming the first conductivity-type collector impurity region; forming the second conductivity-type base impurity region having the first impurity concentration in a predetermined region on the main surface of the collector impurity region; forming the first conductivity-type emitter impurity region having the first depth in a predetermined region on the main surface of the base impurity region; forming the metal layer in contact with a predetermined region on the main surface of the base impurity region; introducing the second conductivity-type impurity to the metal layer; and forming the base contact impurity region having the second impurity concentration higher than the first impurity concentration and the second depth shallower than the first depth by effecting heat treatment for spreading the second conductivity-type impurity introduced to the metal layer over the surface of the base impurity region while forming a silicide of the metal layer.

The metal layer is formed in contact with a predetermined region on the main surface of the base impurity region, the impurity of the second conductivity-type is introduced into that metal layer, and then the heat treatment is effected to spread the impurity of the second conductivity-type which is introduced into the metal layer, and accordingly the base contact impurity region is formed. Thus, a peak position of the impurity concentration can easily be controlled such that it is positioned in the vicinity of the interface between the metal layer and the base impurity region during introducing the impurity into the metal layer. It is, thereby, enabled to increase the surface impurity concentration in the base contact impurity region more easily. As a result, the increase of the base contact resistance will be prevented more effectively even if the surface impurity concentration in the base contact impurity region is reduced during the silicide reaction of the metal layer which is formed on the base contact impurity region. Also, in the method of manufacturing the semiconductor device according to this aspect: a silicide is formed on the metal layer through the same step as the formation of the base impurity region, and thus the manufacturing process can be shortened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
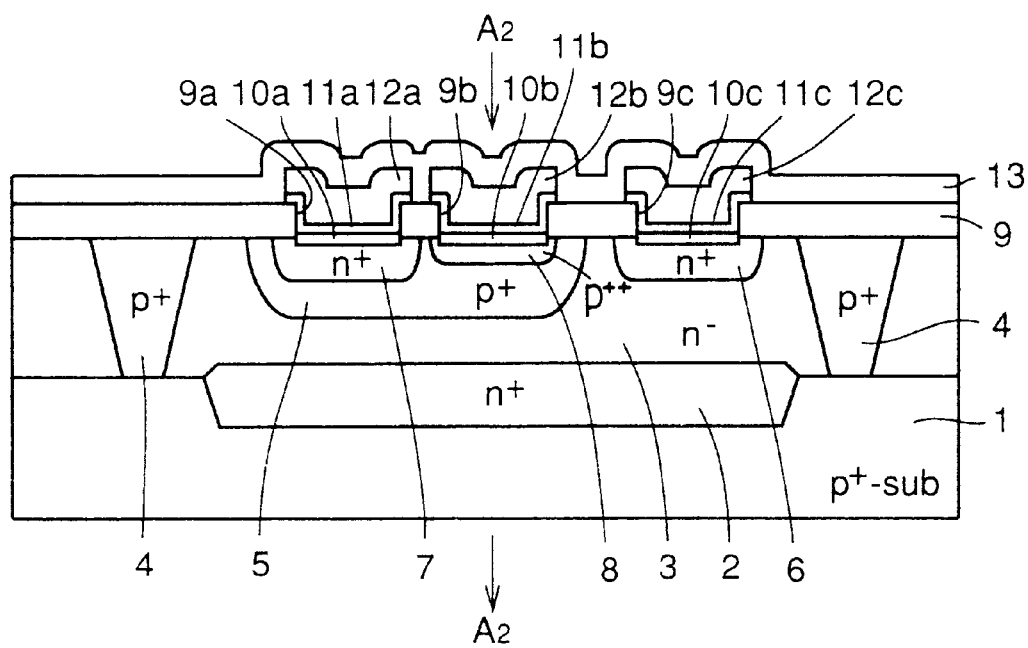
FIG. 1 is a cross-sectional view showing a semiconductor device including a bipolar transistor according to one embodiment of the present invention.

Embodiments of the present invention will be described referring to the drawings.

Referring to FIG. 1, a semiconductor device including a bipolar transistor according to one embodiment of the invention includes a $p^+$-type silicon substrate 1; an $n^+$-type buried diffusion layer 2 which is formed buried in $p^+$-type silicon substrate 1; an $n^-$-type epitaxial layer 3 which is formed on the entire main surface of $p^+$-type silicon substrate 1; a $p^+$-type element isolation layer 4 which is formed in a predetermined region of $n^-$-type epitaxial layer 3; an $n^+$-type collector layer 6 which is formed in a predetermined region on the main surface of $n^-$-type epitaxial layer 3 surrounded by $p^+$-type element isolation layer 4; a $p^+$-type base layer 5 which is formed in a region on the main surface of $n^-$-type epitaxial layer 3 spaced apart by a predetermined distance from $n^+$-type collector layer 6; an $n^+$-type emitter layer 7 which is formed in a predetermined region on the main surface of $p^+$-type base layer 5; and a $p^{++}$-type base contact layer 8 which is formed on the main surface of $p^+$-type base layer spaced apart by a predetermined distance from $n^+$-type emitter layer 7 and has an impurity concentration higher than that of $p^+$-type base layer as well as a diffusion depth shallower than that of $n^+$-type emitter layer 7.

Also, the semiconductor device shown in FIG. 1 includes an insulating oxide film 9 which is formed on the surface of $n^-$-type epitaxial layer 3 and has contact holes 9a, 9b, and 9c on $n^+$-type emitter layer 7, $p^{++}$-type base contact layer 8, and $n^+$-type collector layer 6 respectively; titanium silicide (TiSi$_2$) films 10a, 10b, and 10c which are formed in contact with the surfaces of $n^+$-type emitter layer 7, $p^{++}$-type base contact layer 8, and $n^+$-type collector layer 6 respectively within contact holes 9a, 9b, and 9c; titanium nitride (TiN) layers 11a, 11b, and 11c which are formed on titanium silicide films 10a, 10b, and 10c respectively within contact holes 9a, 9b, and 9c; aluminum interconnection films 12a, 12b, and 12c which are formed on titanium nitride layers 11a, 11b, and 11c respectively; and a protection film 13 which is formed so as to cover the entire surface.

Titanium silicide layers 10a, 10b, and 10c are formed to obtain stable contact with $n^+$-type emitter layer 7, $p^+$-type base contact layer 8, and $n^+$-type collector layer 6 respectively, and its thickness is about 60 to about 100 nm. Titanium nitride layers 11a, 11b, and 11c serve as barrier layers to prevent aluminum interconnection layers 12a, 12b, and 12c, which are formed on the titanium nitride layers, from causing aluminum alloy spike, and its thickness is about 30 to about 70 nm. $n^+$-type collector layer 6 has the impurity concentration of about $5.0 \times 10^{20}$ cm$^{-3}$ and the diffusion depth of about 0.2–0.5 μm. $p^+$-type base layer 5 has the impurity concentration of about $2.0 \times 10^{16}$–$8.0 \times 10^{16}$ cm$^{-3}$ and the diffusion depth of about 0.7–1.2 μm. $n^+$-type emitter layer 7 has the impurity concentration of about $5.0 \times 10^{20}$ cm$^{-3}$ and the diffusion depth of the range from about 0.2 to about 0.5 µm. p$^{++}$-type base contact layer 8 has the impurity concentration of about $1.0 \times 10^{19}$ cm$^{-3}$ and the diffusion depth of the range from about 0.1 to about 0.4 µm. A collector region consists of n$^-$-type epitaxial layer 3, which is surrounded by p$^+$-type isolation layer 4, and n$^+$-type collector layer 6.

In this embodiment, p$^{++}$-type base contact layer 8 which has an impurity concentration higher than p$^+$-type base layer 5 and a diffusion depth shallower than p$^+$-type emitter layer 7 in the base contact region of p$^+$-type base layer 5 is provided. Accordingly, the following effects will be obtained.

Since p$^{++}$-type base contact layer 8, which has an impurity concentration higher than that of p$^+$-type base layer 5, is formed in the base contact region of p$^+$-type base layer 5, even if the surface impurity concentration in p$^{++}$-type base contact layer 8 is reduced by the silicide reaction during formation of titanium silicide film 10b and the impurity in p$^{++}$-type base contact layer 8 is taken in titanium silicide film 10b, the surface impurity concentration of p$^{++}$-type base contact layer 8 can easily be made about $1.0 \times 10^{19}$ cm$^{-3}$ or more after the reduction of the concentration.

Figure 2:
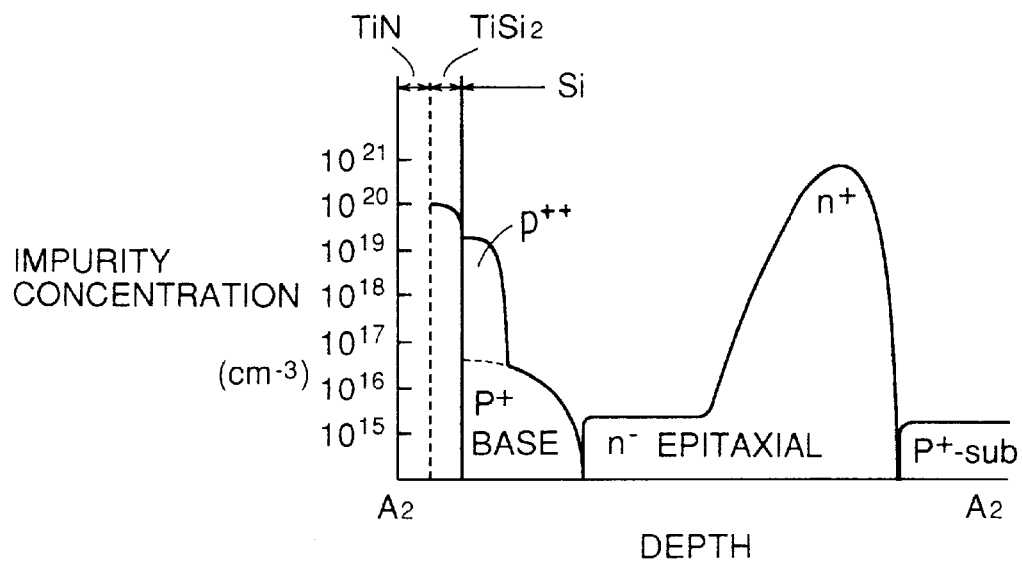
FIG. 2 is a profile of the impurity along line $A_2$—$A_2$ of the semiconductor device shown in FIG. 1.

FIG. 2 is an impurity profile along line A$_2$—A$_2$ of the semiconductor device shown in FIG. 1. Referring to FIG. 2, the surface impurity concentration of p$^{++}$-type base contact layer 8 is $1.0 \times 10^{19}$ cm$^{-3}$ or more after the formation of titanium silicide film 10b. Thus, in order to make the surface impurity concentration of p$^{++}$-type base contact layer 8 about $1.0 \times 10^{19}$ cm$^{-3}$ or more after the silicide reaction, the surface impurity concentration of p$^{++}$-type base contact layer 8 is required to be about $1.0 \times 10^{20}$ cm$^{-3}$ or more before the silicide reaction, which will be described in the following. In this embodiment, the surface impurity concentration of p$^{++}$-type base contact region 8 is set to about $1 \times 10^{19}$ cm$^{-3}$ or more after the silicide reaction, and whereby increase of the base contact resistance conventionally caused by the silicide reaction during formation of titanium silicide film 10b can be effectively prevented. As a result, decrease of the operating speed of the bipolar transistor can be prevented, and safe and low resistance ohmic contact can be obtained in the base contact region.

Figure 3:
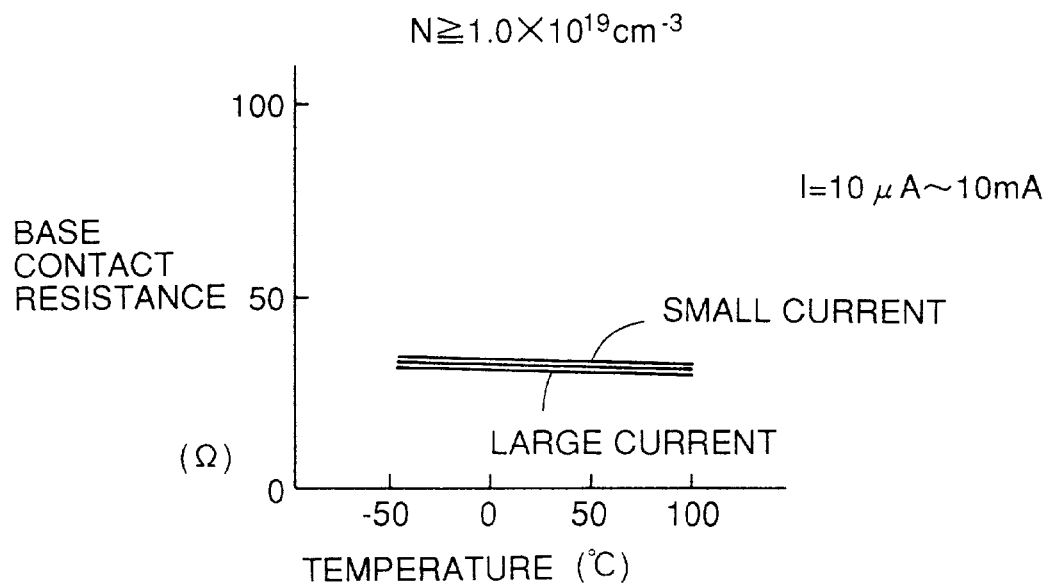
FIG. 3 is a graph showing the relationship of the base contact resistance and temperature when the surface impurity concentration in $p^{++}$-type base contact layer of the semiconductor device shown in FIG. 1 is at least $1.0 \times 10^{19}$ cm$^{-3}$.

By structuring p$^{++}$-type base contact layer 8 to have the surface impurity concentration of $1.0 \times 10^{19}$ cm$^{-3}$ or more after the formation of the silicide, the temperature dependency conventionally developed in the base contact resistance will not be caused. FIG. 3 is a graph showing the relationship between the base contact resistance and temperature when the surface impurity concentration of p$^{++}$-type base contact layer 8 is $1.0 \times 10^{19}$ cm$^{-3}$ or more. Referring to FIG. 3, when the surface impurity concentration of p$^{++}$-type base contact layer 8 is at least $1.0 \times 10^{19}$ cm$^{-3}$, the base contact resistance hardly changes according to the temperature, and thus there is little temperature dependency in the base contact resistance. Accordingly, in this embodiment, change of the characteristics of the circuitry due to temperature change caused by the temperature dependency of the base contact resistance can be effectively prevented.

Figure 39:
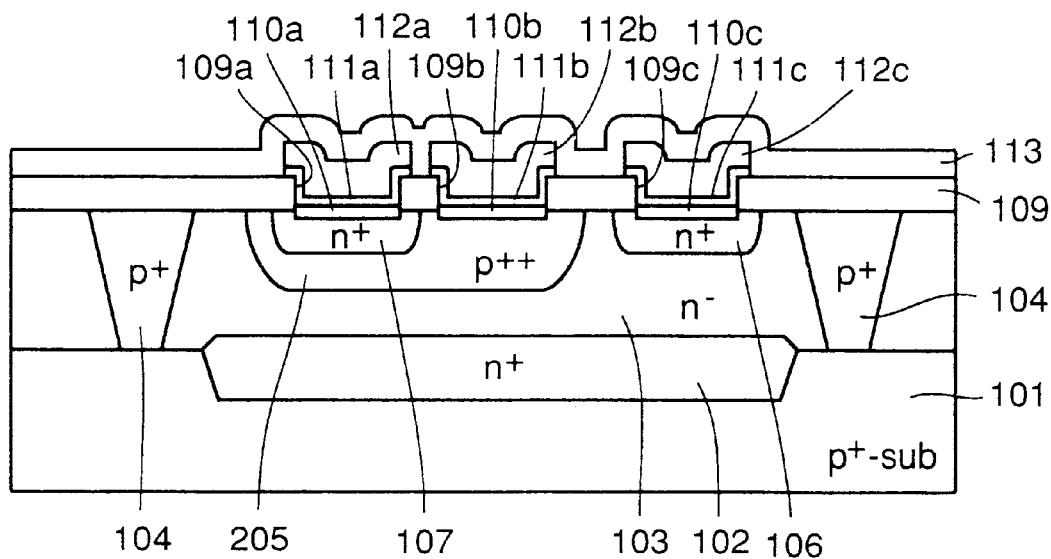
FIG. 39 is a cross-sectional view showing a proposed structure for solving problems of the prior art.

Further, different from the proposed example shown in FIG. 39, p$^{++}$-type base contact layer 8 is formed in the base contact region of p$^+$-type base layer 5 spaced apart by a predetermined distance from n$^+$-type emitter layer 7 in this embodiment, and thus p$^{++}$-type base contact layer 8 of a high concentration does not contact n$^+$-type emitter layer 7. As a result, decrease of the emitter-base reverse breakdown voltage and the current amplification factor, which occur when p$^{++}$-type base contact layer of a high contraction contacts n$^+$-type emitter layer 7, will not be caused. In this embodiment, therefore, stable and low resistance ohmic contact can be obtained in the base contact region without decreasing the emitter-base reverse breakdown voltage and the current amplification factor.

Also, in this embodiment, as shown in FIG. 1, by making the diffusion depth of p$^{++}$-type base contact layer 8 shallower than that of n$^+$-type emitter layer 7, the side of p$^{++}$-type base contact layer 8 having a high concentration is effectively prevented from contacting the side of n$^+$-type emitter layer 7 even when elements are made smaller according to high integration of the semiconductor device. More particularly, in this embodiment, the lateral spread of p$^{++}$-type base contact layer 8 can be reduced by making the diffusion depth of p$^{++}$-type base contact layer 8 shallower than that of n$^+$-type emitter layer 7, and whereby the side of p$^{++}$-type base contact layer 8 having a high concentration is prevented from contacting the side of n$^+$-type emitter layer 7 when elements are made smaller.

Figure 4:
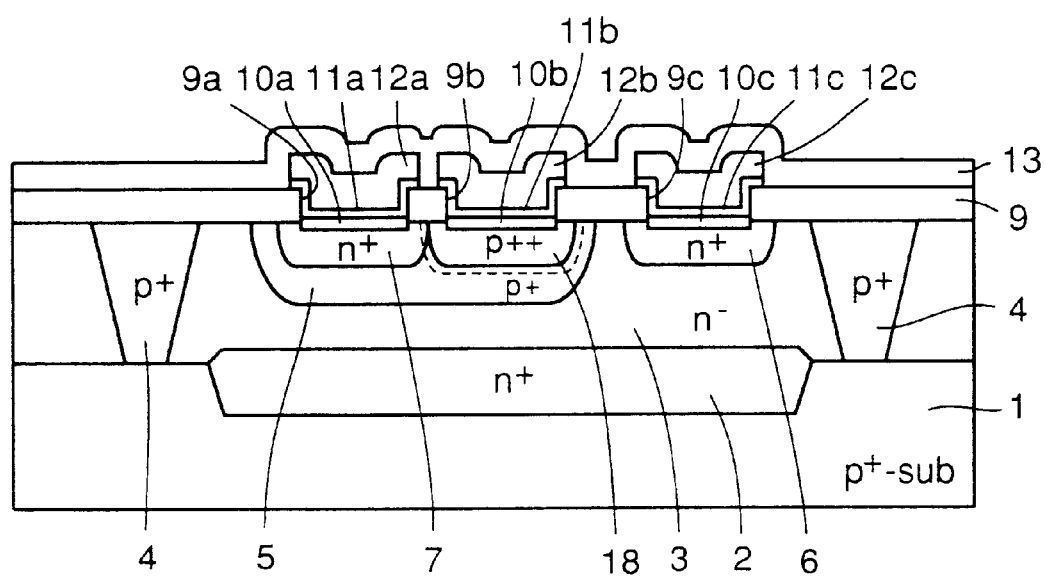
FIG. 4 is a cross-sectional view showing an inconvenience caused when the spread depth of $p^{++}$-type base contact layer becomes deeper than that of $n^{++}$-type emitter layer in a highly integrated semiconductor device.

FIG. 4 is a cross-sectional view illustrating an inconvenience when the diffusion depth of p$^{++}$-type base contact layer 18 becomes deeper than that of n$^+$-type emitter layer 7. Referring to FIG. 4, when the distance between n$^+$-type emitter layer 7 and p$^{++}$-type base contact layer 18 becomes narrower due to miniaturization of elements, if the diffusion depth of p$^{++}$-type base contact layer 18 becomes deeper than that of n$^+$-type emitter layer 7, the side of p$^{++}$-type base contact layer 18 having a high concentration is brought into contact with the side of n$^+$-type emitter layer 7. As a result, the emitter-base reverse breakdown voltage and the current amplification factor are decreased. Therefore, as the embodiment shown in FIG. 1, when the elements are made smaller according to high integration of the semiconductor device, it will be effective to reduce the lateral spread of p$^{++}$-type base contact layer 8 by forming the diffusion depth of p$^{++}$-type base contact layer 8 shallower than that of n$^+$-type emitter layer 7.

Referring to FIGS. 5–17, one manufacturing process of the semiconductor device according to the present embodiment will be described.

Figure 5:
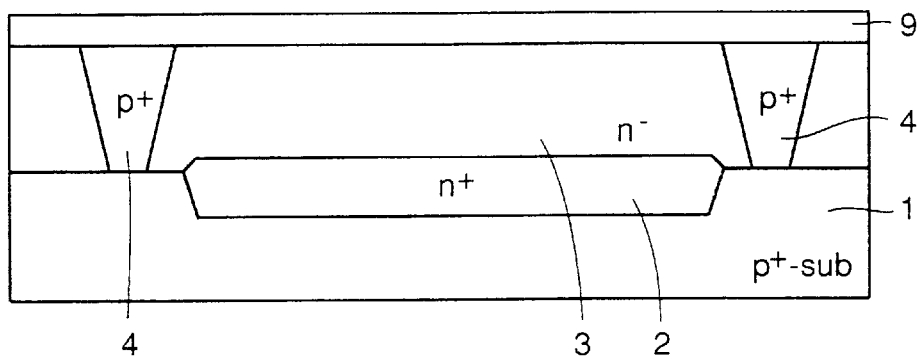
FIGS. 5–12 are cross-sectional views showing first to eighth steps of manufacturing the semiconductor device according to one embodiment shown in FIG. 1.

First, as shown in FIG. 5, an n$^+$-type buried diffusion layer 2 is formed in a P$^+$-type silicon substrate 1. An n$^-$-type epitaxial layer 3 is formed on the entire surface of p$^+$-type silicon substrate 1. A p$^+$-type isolation layer 4 is formed for element isolation in a predetermined region of n$^-$-type epitaxial layer 3. Then, an isolating oxide film 9 is formed on n$^-$-type epitaxial layer 3.

Figure 6:
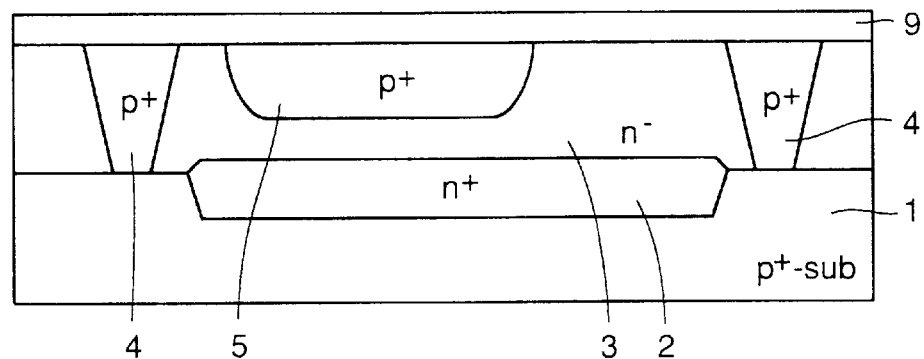

Next, as shown in FIG. 6, p-type impurity is introduced into a predetermined region on the main surface of n$^-$-type epitaxial layer 3 through insulating oxide film 9, for example, by ion implantation. By activating the introduced impurity, p$^+$-type base layer 5 is formed having the impurity concentration of about $5 \times 10^8$ cm$^{-3}$ and the diffusion depth of about 0.7–1.2 µm.

Figure 7:
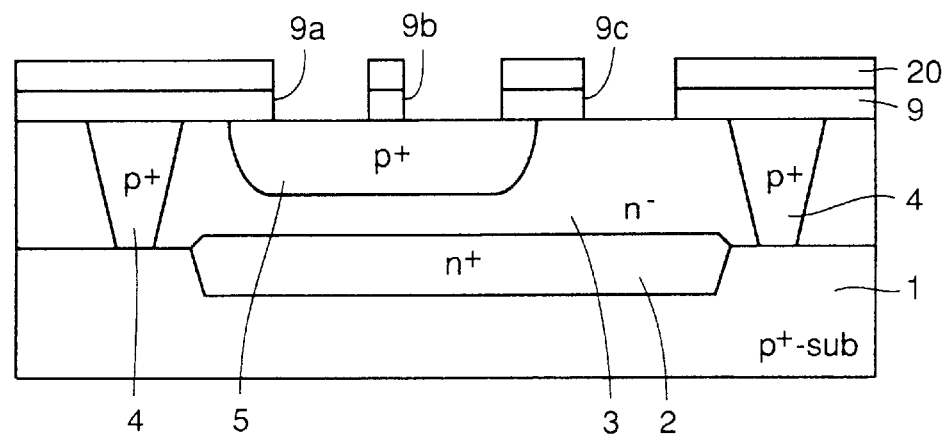

As shown in FIG. 7, after forming photoresist 20 by photolithography in a predetermined region on the surface of insulating oxide film 9, insulating oxide film 9 is anisotropically etched with the photoresist 20 used as a mask, whereby contact holes 9a, 9b, and 9c are formed. Photoresist 20 is then removed.

Figure 8:
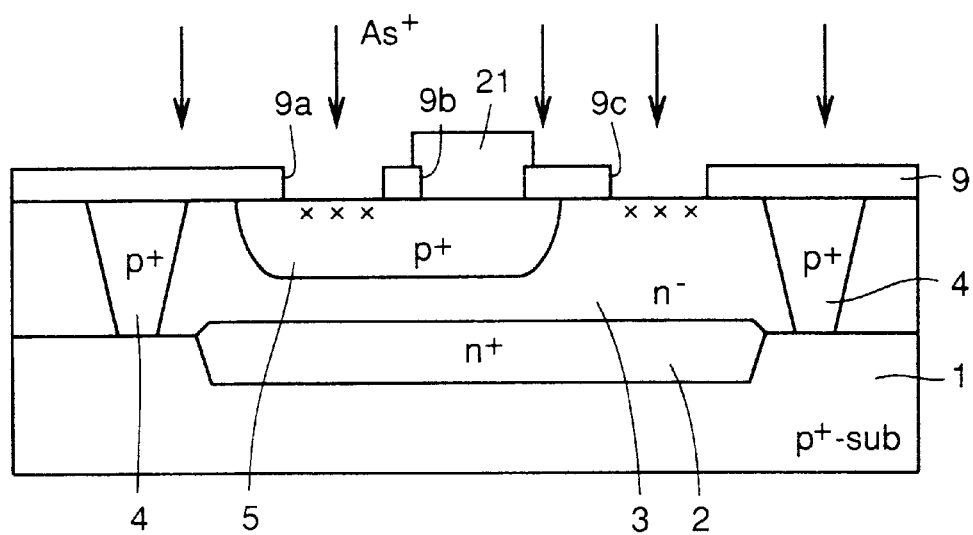

As shown in FIG. 8, photoresist 21 will be formed by photolithography so as to cover contact hole 9b in the region where the base electrode of the bipolar transistor is formed.

Figure 9:
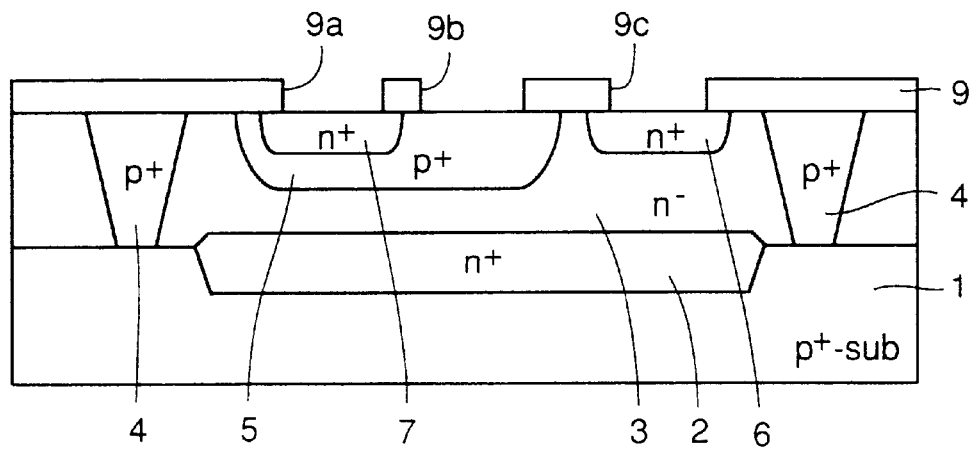

After that, n-type impurity such as arsenic ion (As$^+$) is implanted on the entire surface. Resist 21 is then removed. By activating the ion-implanted impurity, an n$^+$-type collector layer 6 having the impurity concentration of about $5.0 \times 10^{20}$ cm$^{-3}$ and the diffusion depth of about 0.2–0.5 μm, as well as an n$^+$-type emitter layer 7 having the impurity concentration of about $5.0 \times 10^{20}$ cm$^{-3}$ and the diffusion depth of about 0.2–0.5 μm are formed as shown in FIG. 9.

Figure 10:
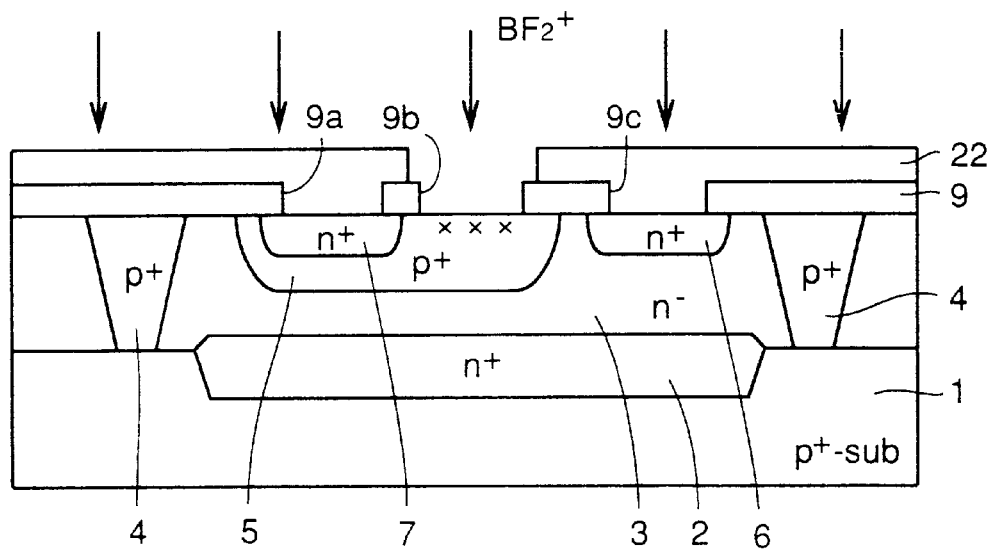
Figure 11:
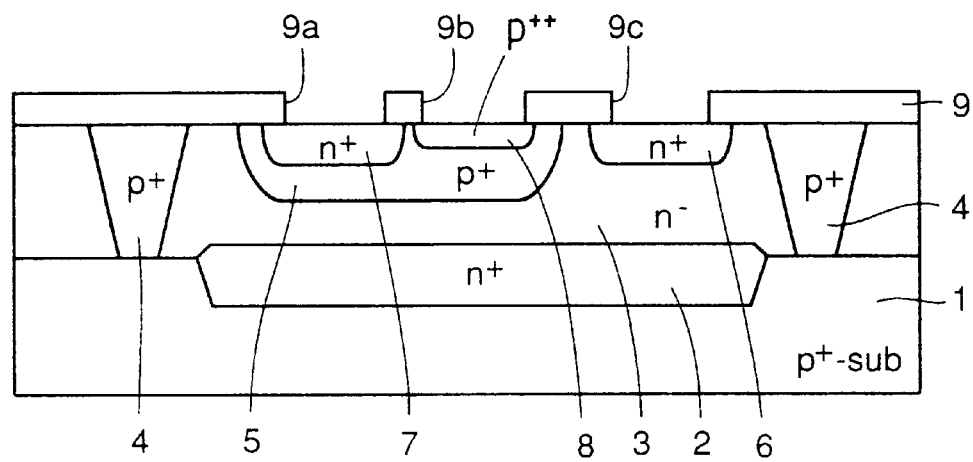

As shown in FIG. 10, photoresist 22 is formed by photolithography to cover the portions other than contact hole 9b. Using photoresist 22 and insulating oxide film 9 as masks, p-type impurity such as BF$_2^+$ is introduced in a self-aligned method into the surface region of p$^+$-type base layer 5, for example, by the ion implantation. By activating the introduced impurity under the temperature condition of at least 900° C., p$^{++}$-type base contact layer 8 is formed having the diffusion depth (about 0.1–0.4 μm) shallower than that of n$^+$-type emitter layer 7 and the surface impurity concentration of at least about $1.0 \times 10^{20}$ cm$^{-3}$ as shown in FIG. 11.

Figure 12:
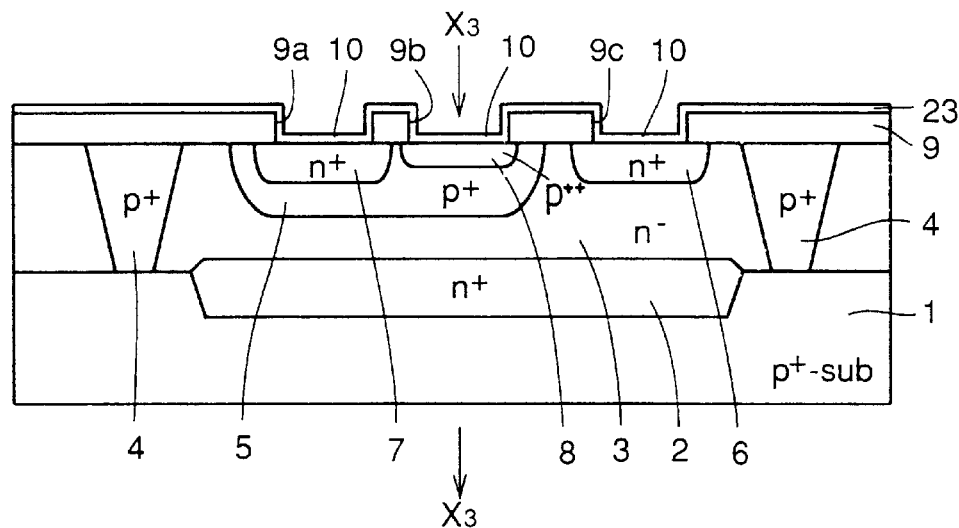
Figure 13:
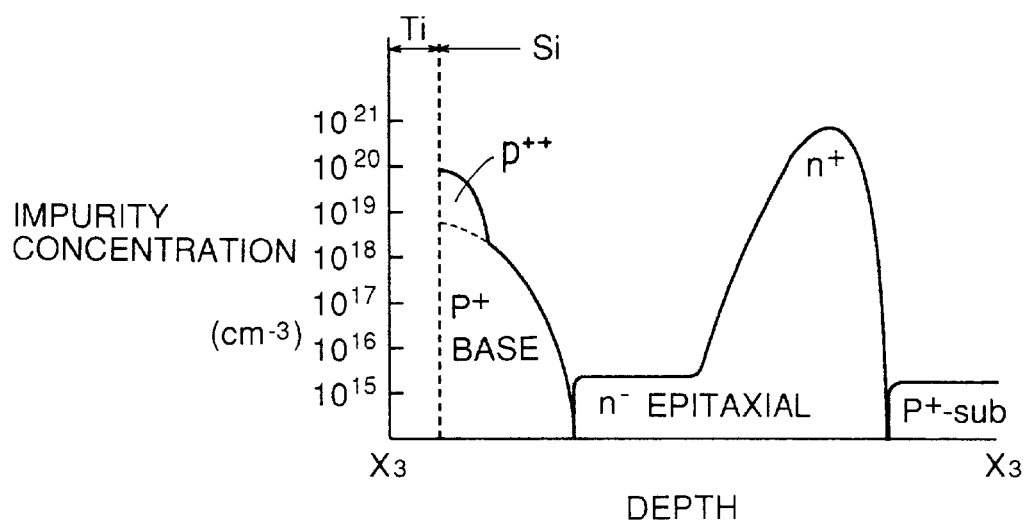
FIG. 13 is a profile of the impurity along line $X_3$—$X_3$ in the step shown in FIG. 12.

As shown in FIG. 12, titanium (Ti) film 23 having a thickness of about 40–100 nm is formed, for example, by sputtering method so as to cover the entire surface. Referring to FIG. 13, the surface impurity concentration in p$^{++}$-type base contact layer 8 is set to at least about $1 \times 10^{20}$ cm$^{-3}$ in the step before the silicide reaction shown in FIG. 12.

Figure 14:
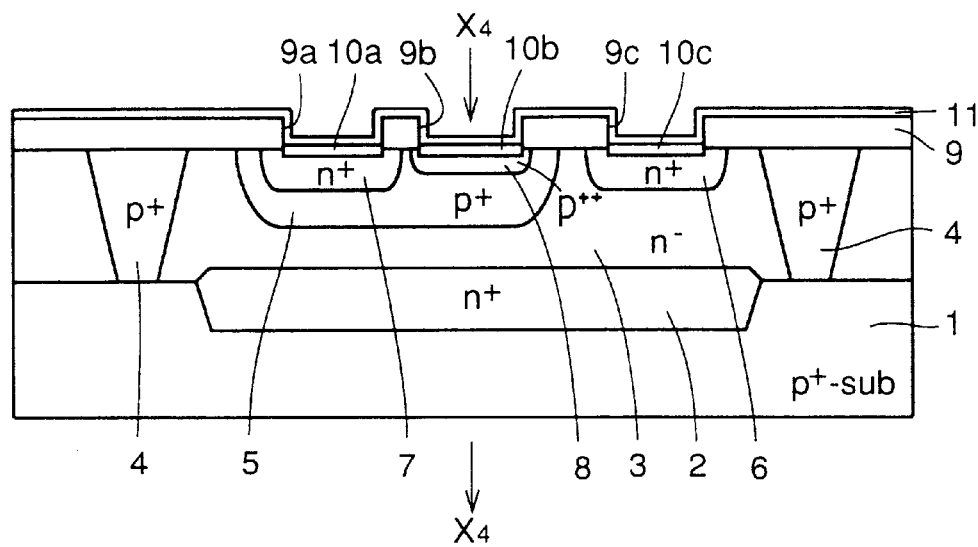
FIG. 14 is a cross-sectional view showing the ninth step of manufacturing the semiconductor device according to one embodiment shown in FIG. 1.
Figure 15:
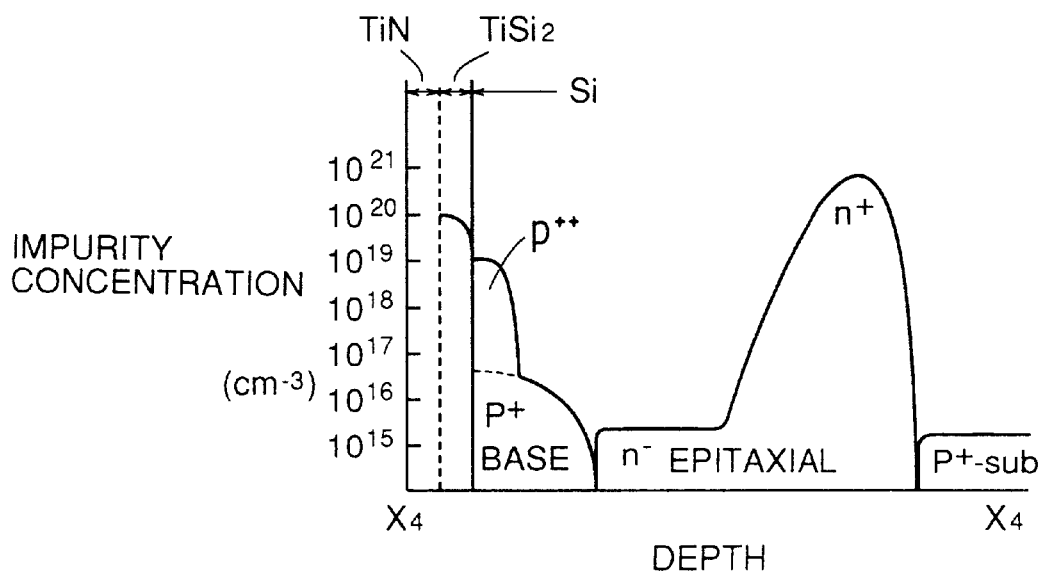
FIG. 15 is a profile of the impurity along line $X_4$—$X_4$ in the step shown in FIG. 14.

As shown in FIG. 14, titanium silicide (TiSi$_2$) films 10a, 10b, and 10c as well as titanium nitride (TiN) layer 11 are formed by applying the heat treatment for about 30 seconds in the atmosphere of N$_2$ under the temperature condition of 750–850° C. More particularly, by silicide reaction between titanium (Ti) in titanium layer 23 and silicon (Si) in n$^-$-type epitaxial layer 3, titanium silicide (TiSi$_2$) films 10a, 10b, and 10c are formed on the surfaces of n$^+$-type emitter layer 7, p$^{++}$-type base contact layer 8, and n$^+$-type collector layer 6, respectively. At the same time, by nitriding titanium (Ti) layer 23 in the atmosphere of N$_2$, titanium nitride (TiN) layer 11 will be formed. Titanium silicide films 10a, 10b, and 10c are formed to have a film thickness of about 60–100 nm respectively, while the titanium nitride layer 11 is formed to have a film thickness of about 30–70 nm.

The surface impurity concentration in p$^{++}$-type base contact layer 8 after the silicide reaction is decreased down to about $1 \times 10^{19}$ cm$^{-3}$ as shown in FIG. 14, because the impurity in p$^{++}$-type base contact layer 8 is taken in titanium silicide (TiSi$_2$) film 15b during silicide reaction. In this embodiment, however, even if the surface impurity concentration of p$^{++}$-type base contact layer 8 is decreased due to the silicide reaction, p$^{++}$-type base contact layer 8 is formed to have the surface impurity concentration of at least $1 \times 10^{19}$ cm$^{-3}$ after the decrease. Thus, even if the surface impurity concentration of p$^{++}$-type base contact layer 8 is decreased due to the silicide reaction, the base contact resistance will not increase abruptly as before. Accordingly, the reduction of the operating speed of the bipolar transistor can be prevented effectively, and the safe and low resistance ohmic contact can be obtained in the base contact region.

Figure 16:
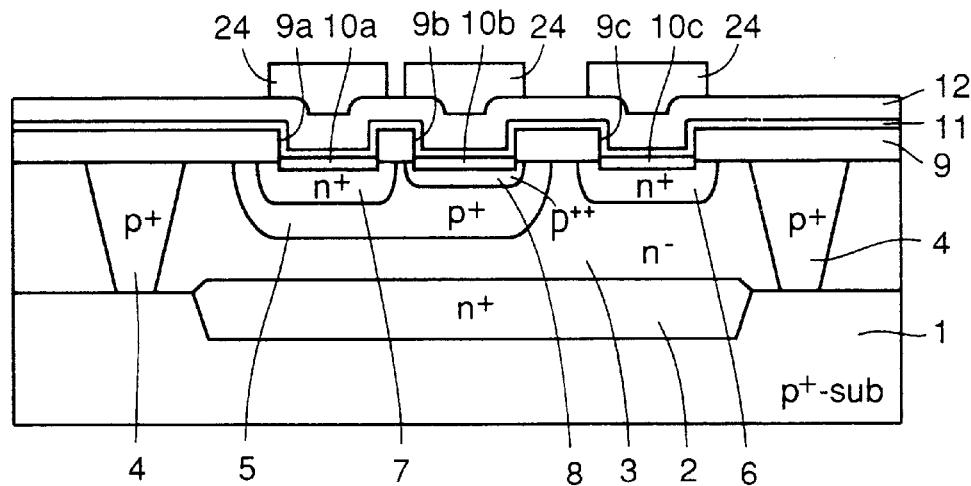
FIGS. 16 and 17 are cross-sectional views showing tenth and eleventh steps of manufacturing the semiconductor device according to one embodiment shown in FIG. 1.
Figure 17:
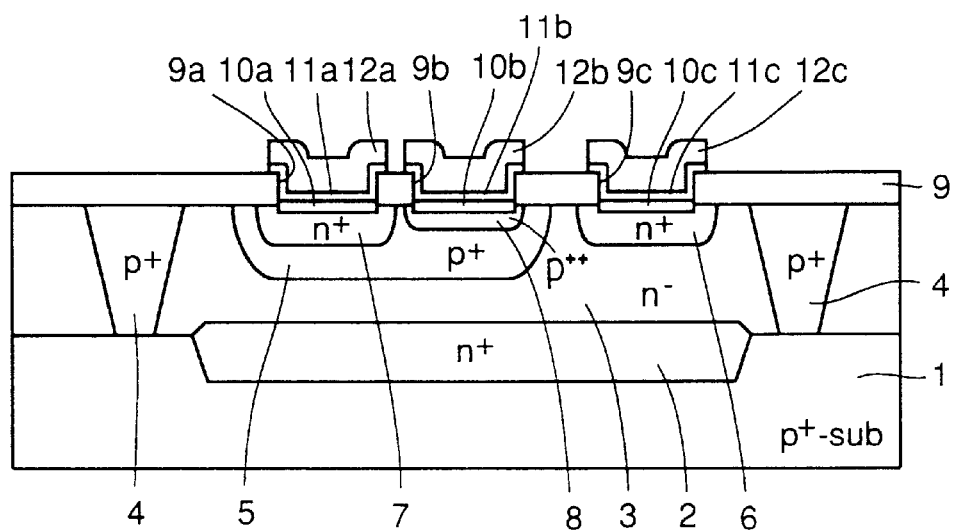

As shown in FIG. 16, after forming aluminum interconnection layer 12 on titanium nitride layer 11, photoresist 24 is formed by photolithography in the predetermined region on the aluminum interconnection layer 12. By etching aluminum interconnection layer 12 and titanium nitride layer 11 anisotropically using photoresist 24 as a mask, titanium nitride (TiN) films 11a, 11b, and 11c as well as aluminum interconnection films 12a, 12b, and 12c are formed as shown in FIG. 17.

Finally, as shown in FIG. 1, the semiconductor device including the bipolar transistor according to this embodiment is completed by forming protection film 13 covering the entire surface.

Referring to FIGS. 18–21, another manufacturing process of the semiconductor device according to the present embodiment will be described.

Figure 18:
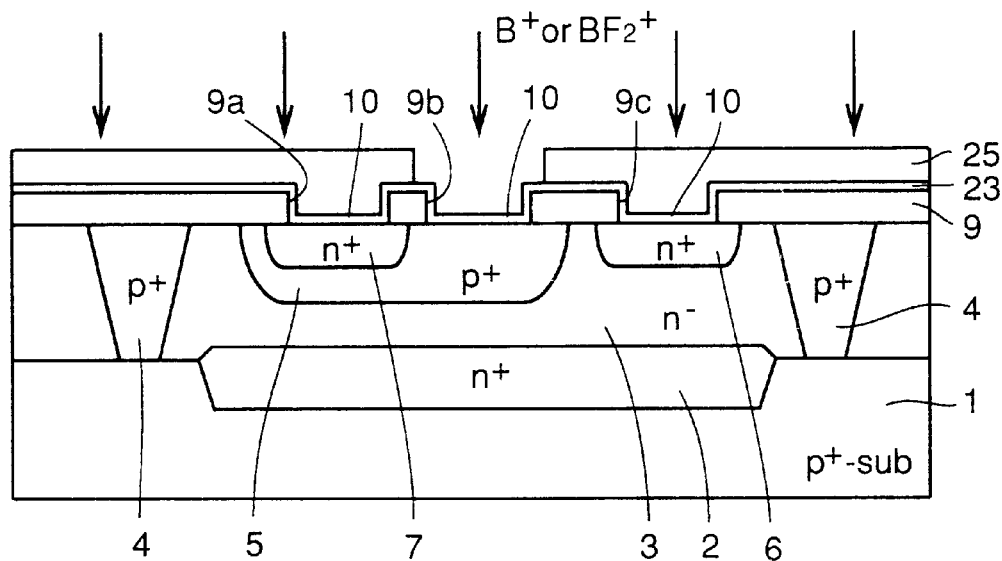
FIGS. 18–21 are cross-sectional views showing first to fourth steps of another manufacturing process of the semiconductor device according to one embodiment shown in FIG. 1.

First, as shown in FIG. 18, the steps up to formation of titanium film 23 are carried out through the same manufacturing steps as in the manufacturing process shown in FIGS. 5–12. After that, photoresist 25 is formed by photolithography in the region other than the region corresponding to the base electrode region on titanium film 23. Using the photoresist 25 as a mask, BF$_2$ or B ions are implanted to titanium film 23. The ion implantation into titanium film 23 is carried out such that the impurity concentration has its peak position in the vicinity of the interface between titanium film 23 and p$^+$-type base layer 5. More particularly, the ion implantation is carried out so that the impurity concentration in the vicinity of that interface is at least about $1 \times 10^{20}$ cm$^{-3}$. Photoresist 25 is then removed.

Figure 19:
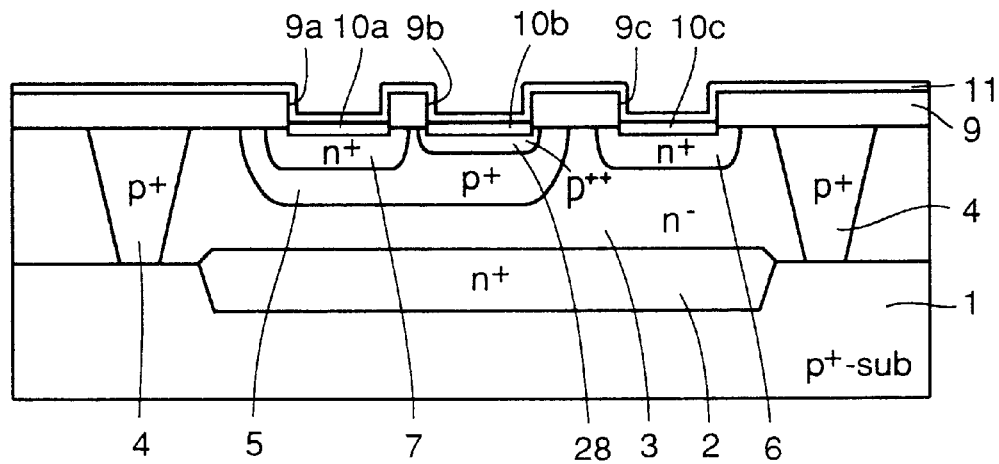

As shown in FIG. 19, the heat treatment is carried out for about 30 seconds in the atmosphere of N$_2$ under the temperature condition of 750–850° C. Accordingly, titanium silicide (TiSi$_2$) films 10a, 10b, and 10c, titanium nitride (TiN) layer 11, as well as p$^{++}$-type base contact layer 28 having the impurity concentration of at least about $1.0 \times 10^{19}$ cm$^{-3}$ and the diffusion depth of the range from about 0.1 to about 0.4 μm which is shallower than that of n$^+$-type emitter layer 7 are formed in a self-aligned method. More particularly, by silicide reaction of titanium (Ti) in titanium film 23 and silicon (Si) in n$^-$-type epitaxial layer 3 through the heat treatment, titanium silicide (TiSi$_2$) films 10a, 10b, and 10c are formed, while titanium nitride (TiN) layer 11 is formed by nitriding titanium film 23 in the atmosphere of N$_2$. Further, by thermal diffusion of p-type impurity introduced into titanium film 23 simultaneously during the heat treatment in p$^+$-type base layer 5, p$^{++}$-type base contact layer 28 having the impurity concentration of at least about $1 \times 10^{19}$ cm$^{-3}$ and the diffusion depth of about 0.1–0.4 μm shallower than that of n$^+$-type emitter layer 7 is formed.

Thus, in this another manufacturing process, p$^{++}$-type base contact layer 28 will be formed simultaneously during the formation of titanium silicide films 10a, 10b, and 10c, so that activation step of p$^{++}$-type base contact layer 28 (see FIG. 11) can be omitted as compared to the manufacturing process described using FIGS. 5–17, and thus the manufacturing process can be simplified. Also, in this another manufacturing process, the implanted impurity is thermally diffused after ion implantation of the impurity into titanium film 23, so that the impurity concentration can easily be controlled such that its peak is positioned in the vicinity of the interface between titanium film 23 and p$^+$-type base layer 5 during ion implantation of the impurity. Accordingly, the surface impurity concentration in p$^{++}$-type base contact layer 28 which is formed through diffusing the implanted impurity can easily be increased while the diffusion depth of p$^{++}$-type base contact layer 28 can be made shallower.

Figure 20:
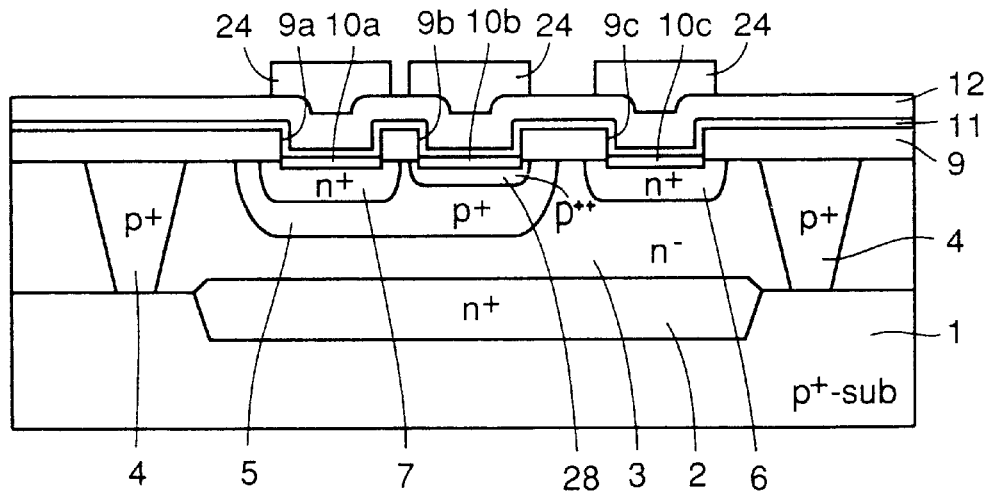
Figure 21:
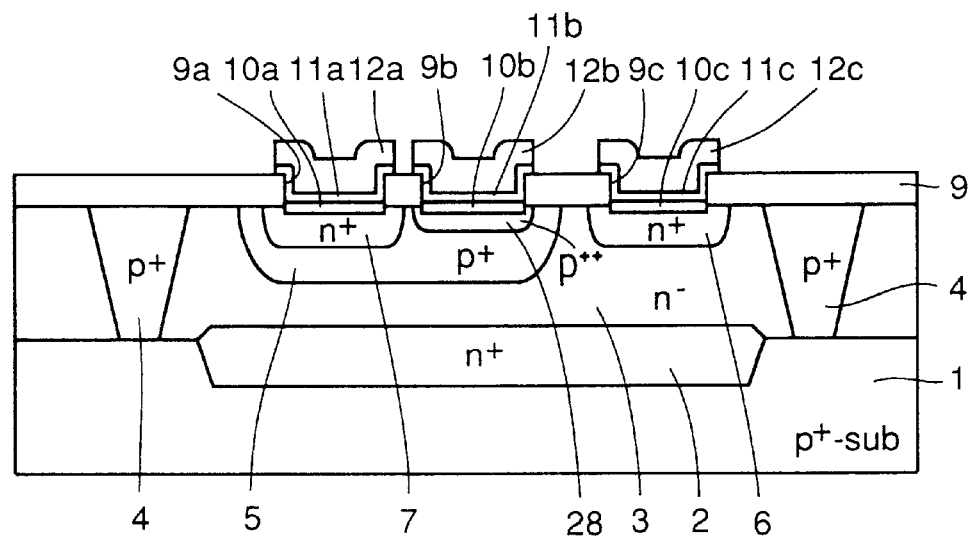
Figure 22:
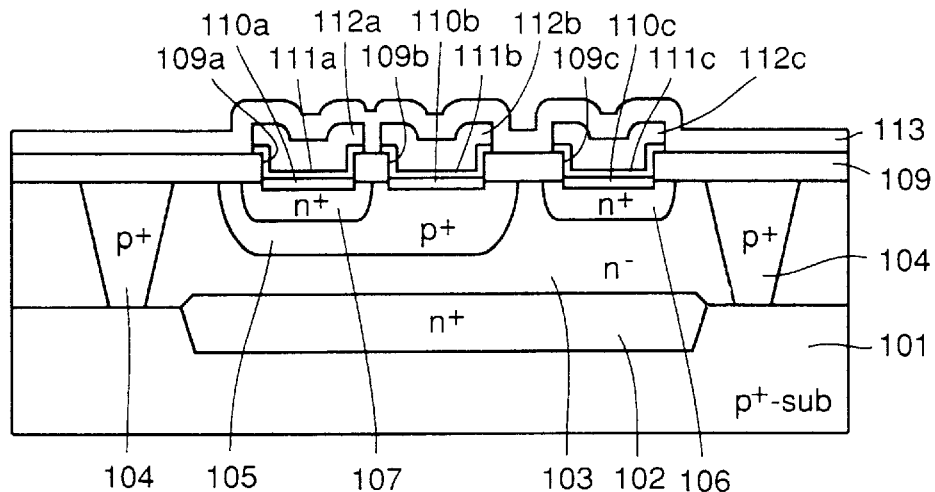
FIG. 22 is a cross-sectional view showing a conventional semiconductor device including a bipolar transistor.
Figure 23:
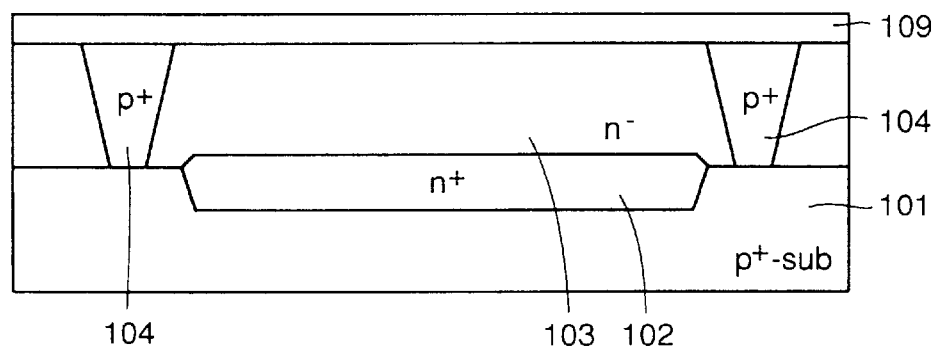
FIGS. 23–32 are cross-sectional views showing first to tenth steps of manufacturing the conventional semiconductor device shown in FIG. 22.
Figure 24:
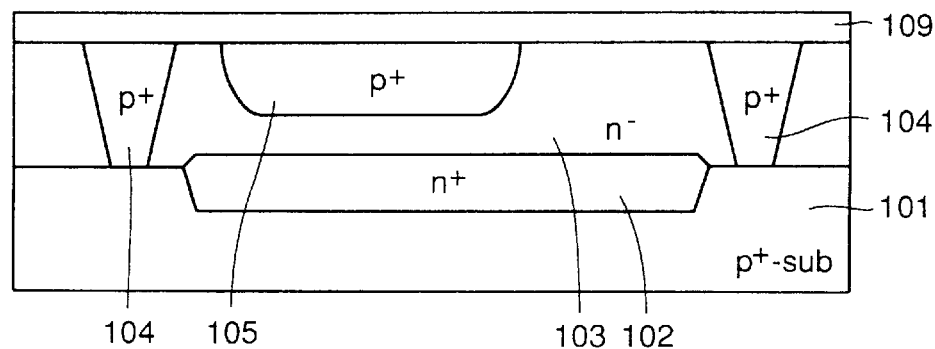
Figure 25:
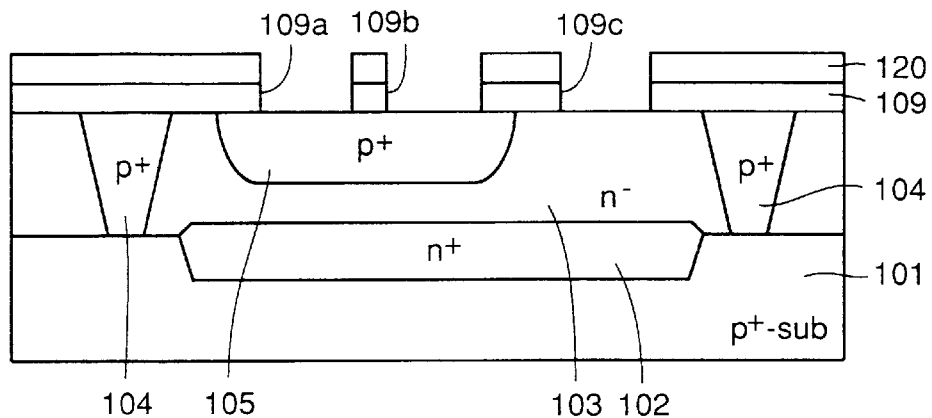
Figure 26:
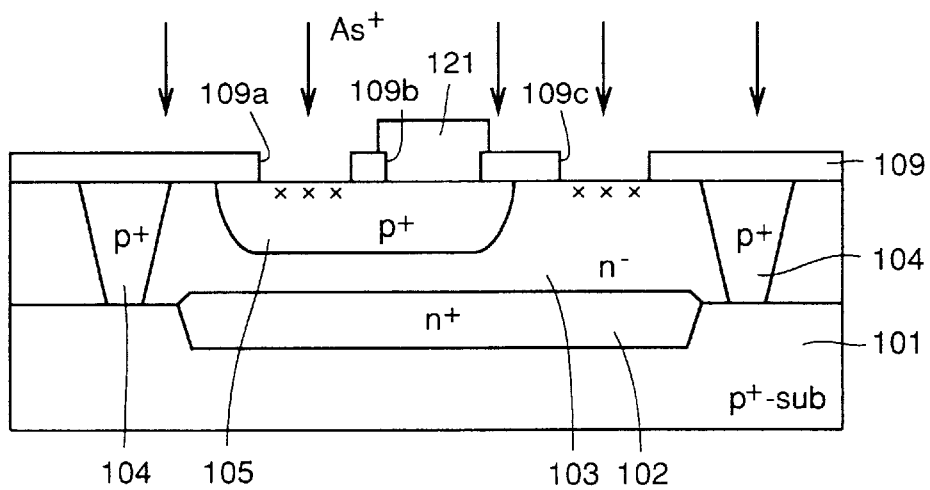
Figure 27:
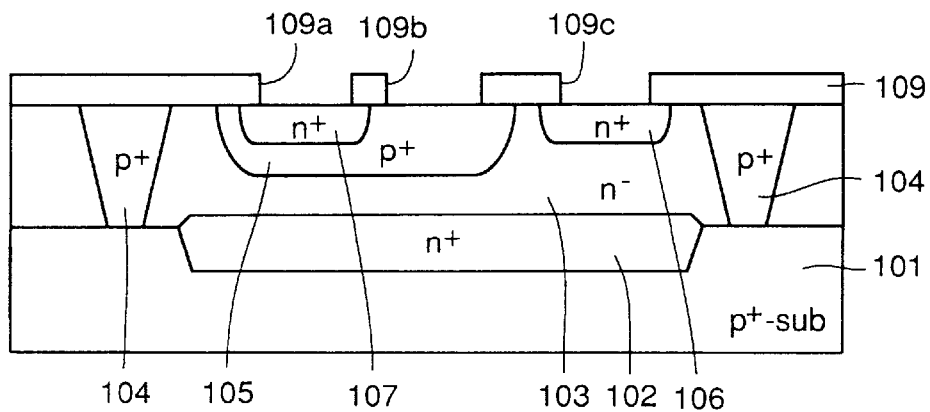
Figure 28:
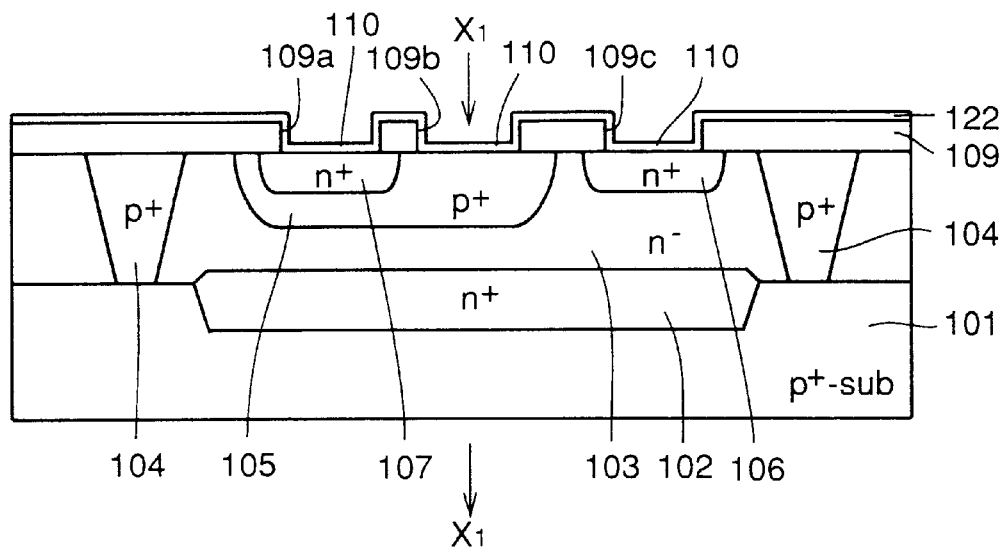
Figure 29:
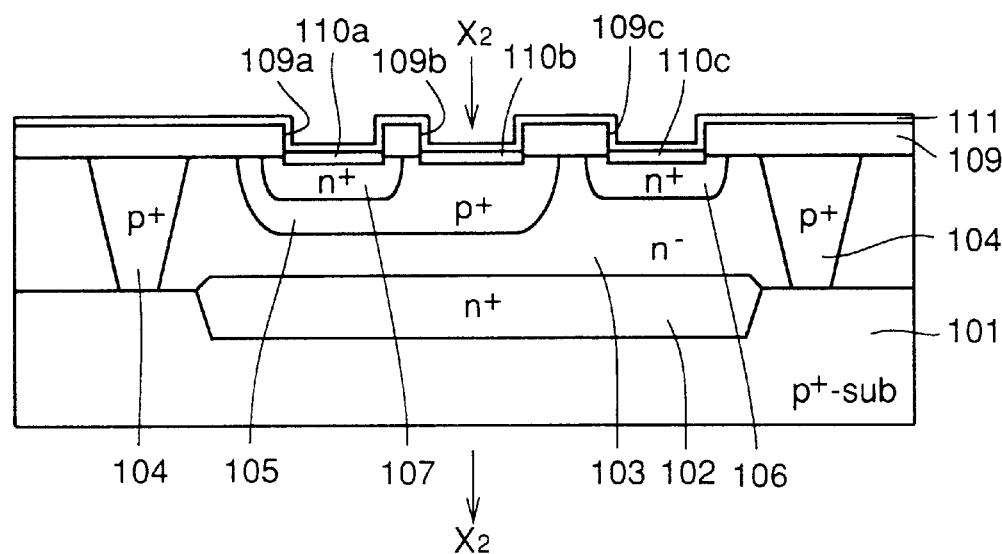
Figure 30:
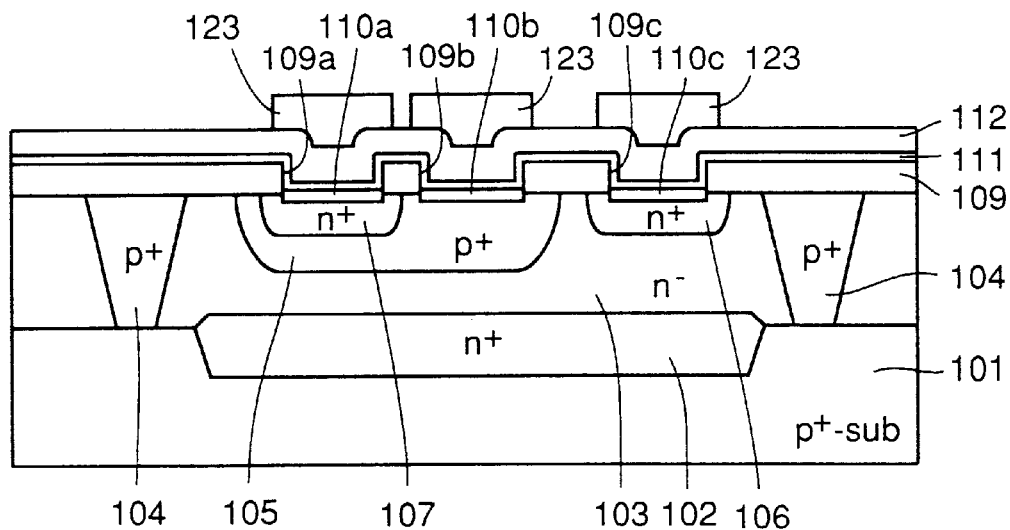
Figure 31:
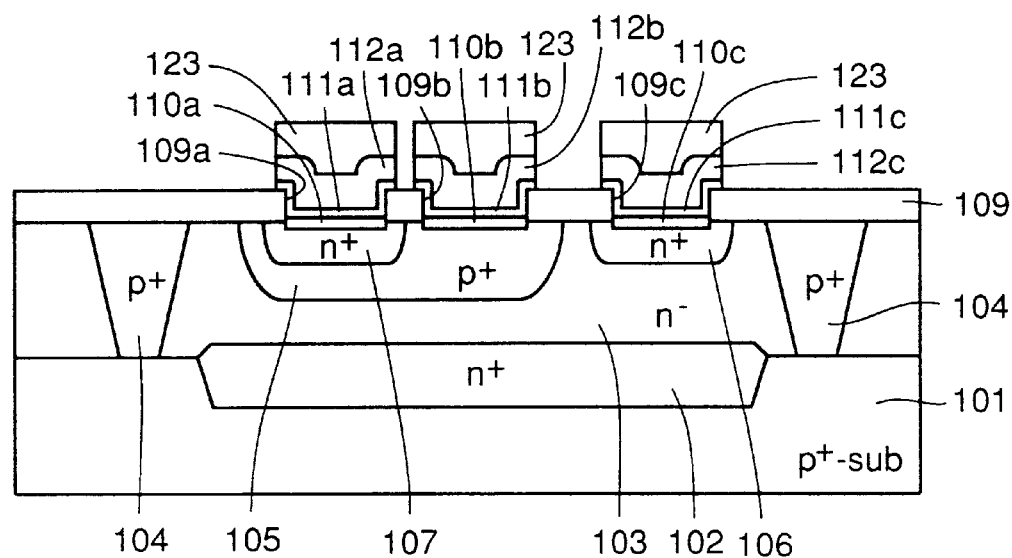
Figure 32:
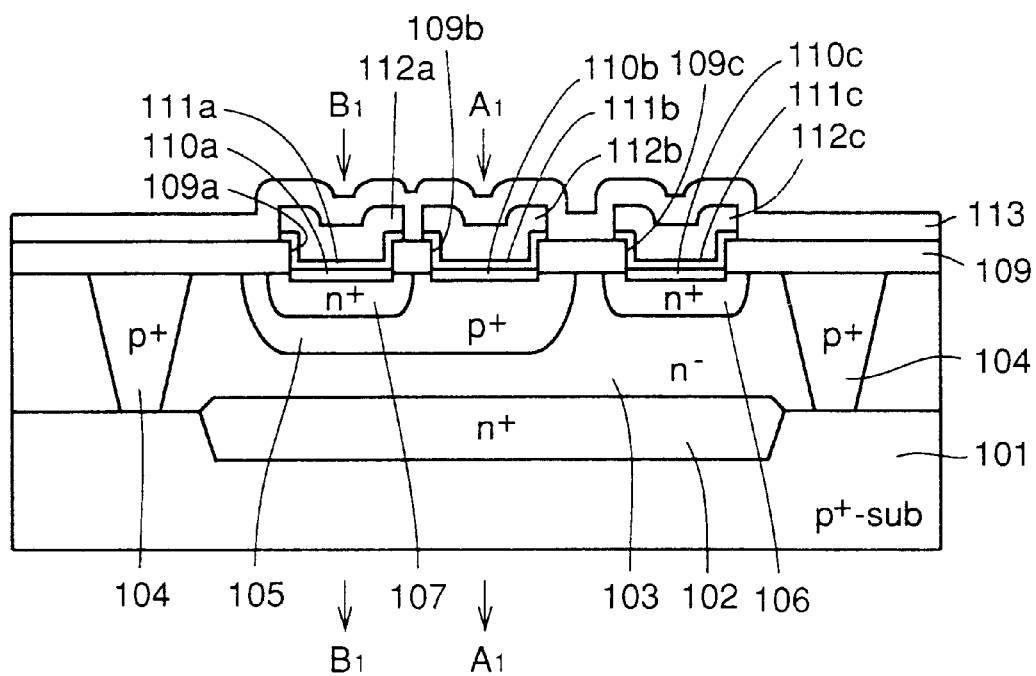
Figure 33:
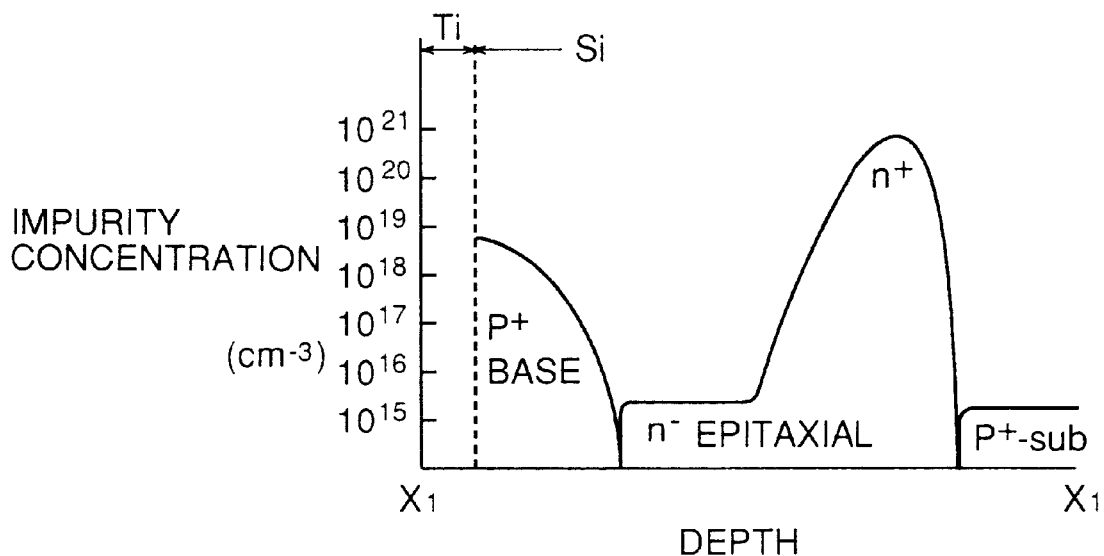
FIG. 33 is a profile of the impurity along line $X_1$—$X_1$ in the step shown in FIG. 28.
Figure 34:
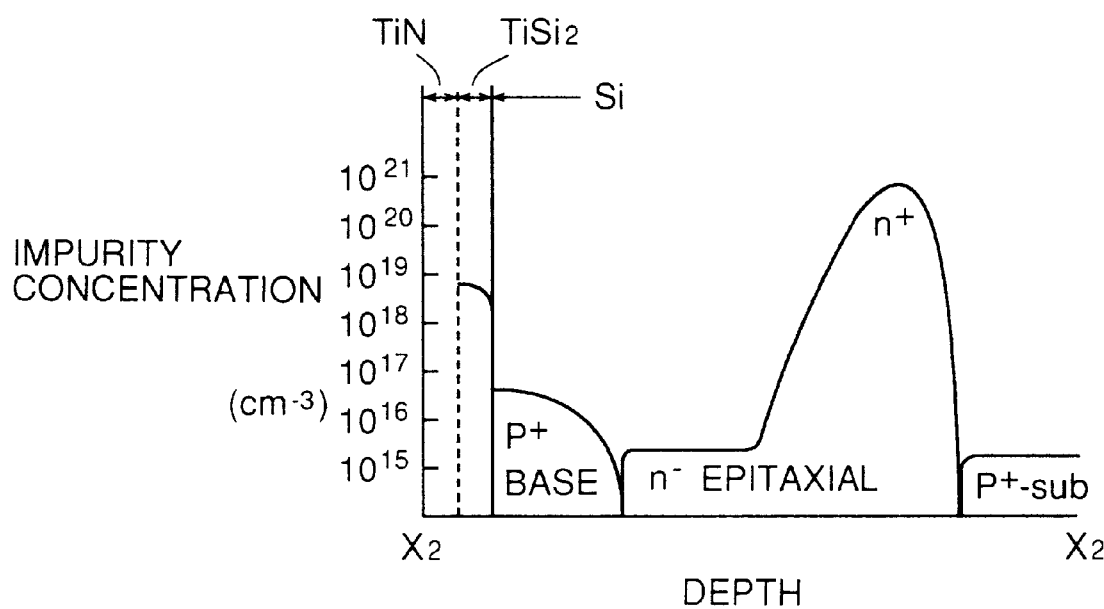
FIG. 34 is a profile of the impurity along line $X_2$—$X_2$ in the step shown in FIG. 29.
Figure 35:
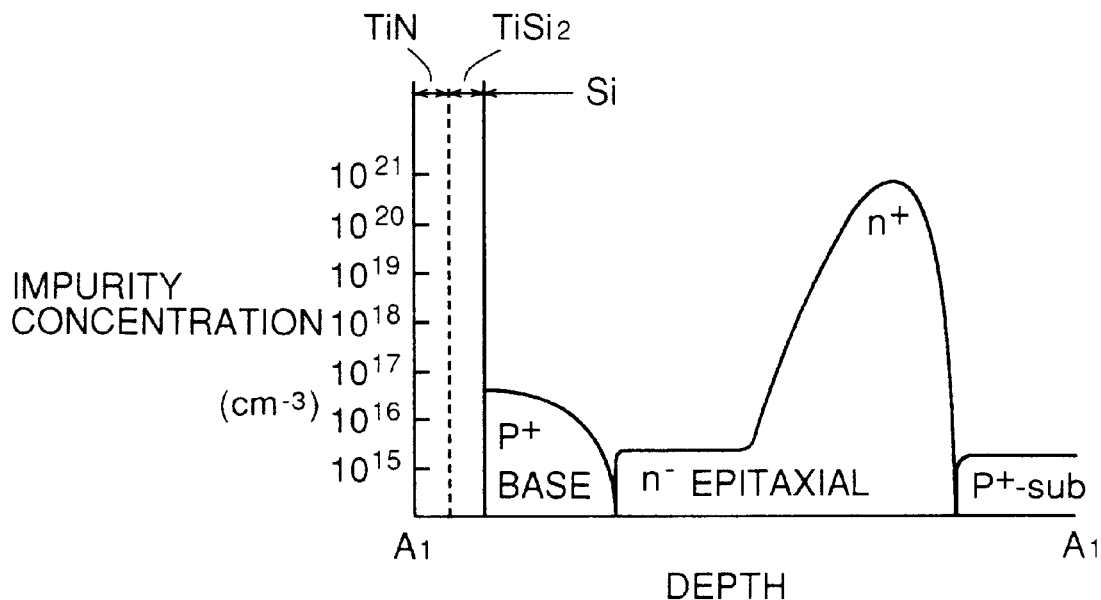
FIG. 35 is a profile of the impurity along line $A_1$—$A_1$ after a series of manufacturing steps shown in FIG. 32.
Figure 36:
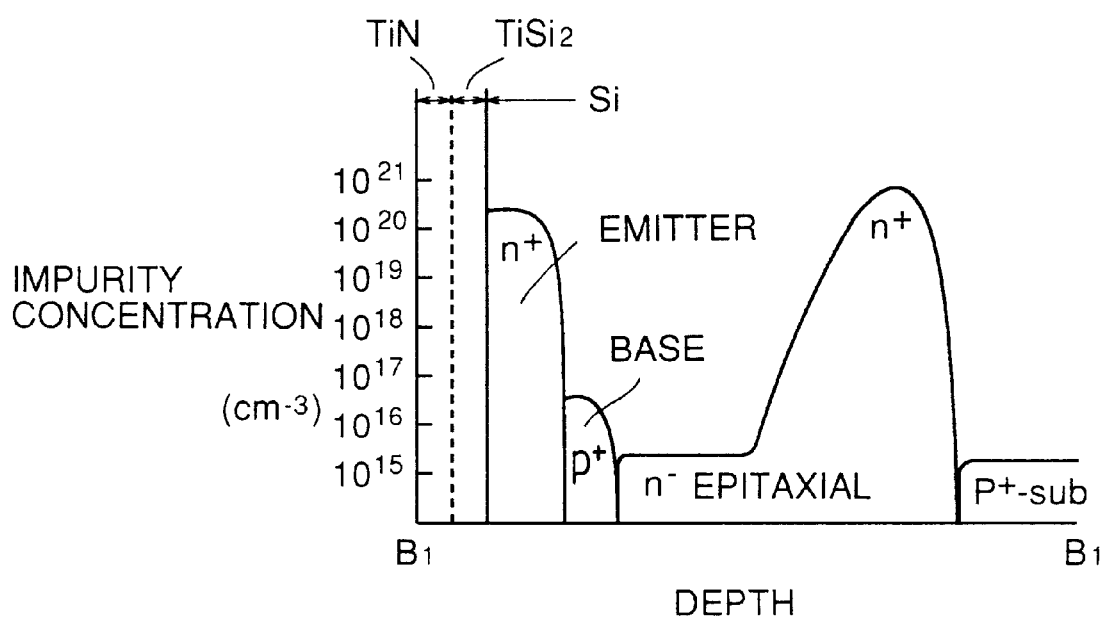
FIG. 36 is a profile of the impurity along line $B_1$—$B_1$ after a series of manufacturing steps shown in FIG. 32.
Figure 37:
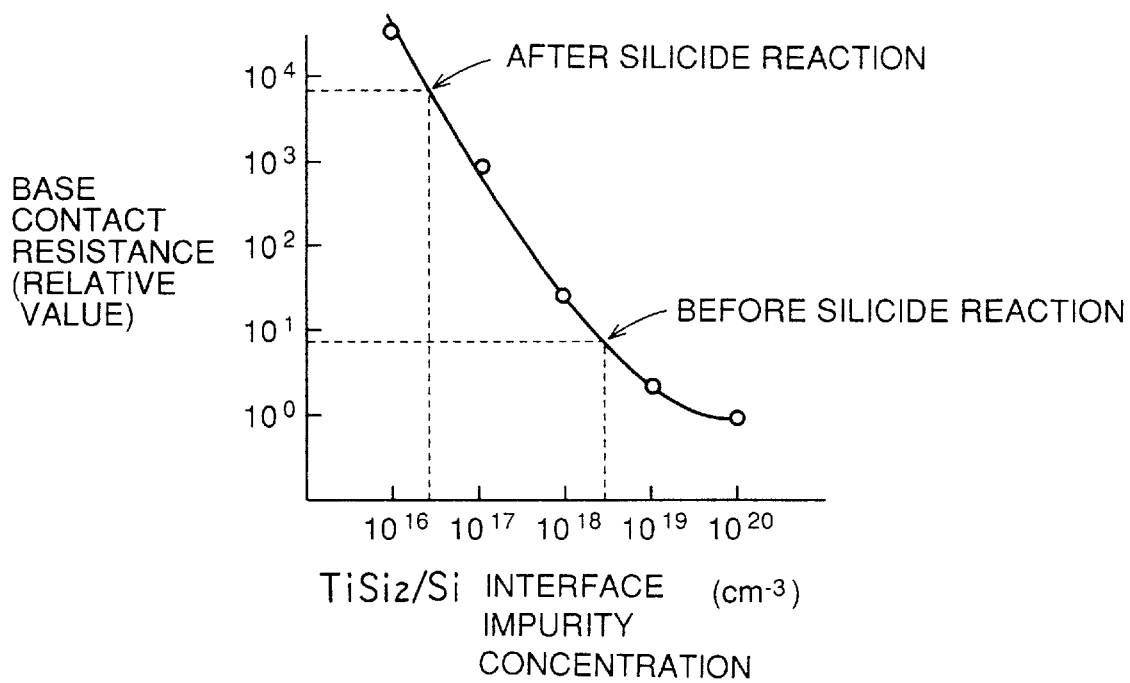
FIG. 37 is a graph showing the relationship of the impurity concentration at the interface between titanium silicide and silicon, and of the value of the base contact resistance.
Figure 38:
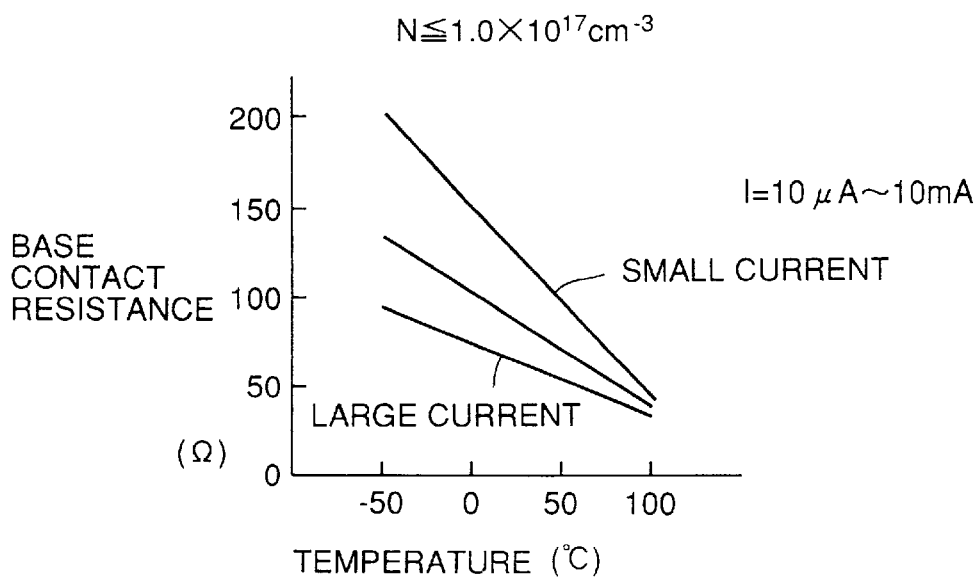
FIG. 38 is a graph showing the relationship of the base contact resistance and temperature when the surface impurity concentration in $p^+$-type base layer is not more than $1.0 \times 1.0^{17}$ cm$^{-3}$.

Then, as shown in FIG. 20, aluminum interconnection layer 12 is formed on titanium nitride layer 11. Photoresist 24 is formed by photolithography in a predetermined region on aluminum interconnection layer 12. Using photoresist 24 as a mask, aluminum interconnection layer 12 and titanium nitride layer 11 are etched anisotropically, and thus titanium nitride (TiN) films 11a, 11b, and 11c as well as aluminum interconnection films 12a, 12b, and 12c are formed as shown in FIG. 21.

Finally, as shown in FIG. 1, protection film 13 is formed to cover the entire surface. The semiconductor device including the bipolar transistor shown in FIG. 1 can be formed also through another manufacturing process.

Although formation of titanium silicide films 10a, 10b, and 10c has been described in the above embodiment, the present invention is not limited thereto, but also applicable when the metal silicide films, for example, $ZrSi_x$, $HfSi_x$, $VSi_x$, $NbSi_x$, $TaSi_x$, $CrSi_x$, $MoSi_x$, $WSi_x$, $FeSi_x$, $RuSi_x$, $OsSi_x$, $RhSi_x$, $IrSi_x$ other than titanium silicide films 10a, 10b, and 10c are formed.

As described above, in the semiconductor device according to the present invention, the second conductivity-type base contact impurity region having the second impurity concentration higher than the first impurity concentration is formed on the main surface of the second conductivity-type base impurity region having the first impurity concentration. Thus, even if the impurity in the base contact impurity region is taken in the metal silicide layer by formation of the metal silicide layer on the base contact impurity region and the surface impurity concentration in the base contact impurity region is decreased, the conventional increase of the base contact resistance can be effectively prevented. Accordingly, the decrease of the operating speed of the elements can be effectively prevented, and the stable and low resistance ohmic contact can be obtained in the base contact region. Also, by forming the base contact impurity region spaced apart by a predetermined distance from the emitter impurity region, the base contact impurity region having a high concentration does not contact the emitter impurity region, whereby various inconveniences such as the decrease of the emitter-base breakdown voltage caused when the base contact impurity region having a high concentration contacts the emitter impurity region can be prevented. Further, by forming the base contact impurity region to have the second depth shallower than the first depth of the emitter impurity region, the lateral spread of the base contact impurity region can be reduced, and thus the side of the base contact impurity region having a high concentration can be effectively prevented from contacting the side of the emitter impurity region even when the elements are miniaturized according to high integration of the semiconductor device.

According to another semiconductor device of the present invention, the second conductivity-type base contact impurity region having the second impurity concentration higher than the first impurity concentration is formed on the main surface of the second conductivity-type base impurity region having the first impurity concentration, and the metal silicide layer is formed at least on the base contact impurity region. Thus, even if the impurity in the base contact impurity region is taken in the metal silicide layer by formation of the metal silicide layer so that the surface impurity concentration of the base contact impurity region is decreased, the increase of the resistance of the base contact can be prevented effectively as before. Accordingly, the decrease of the operating speed of elements can be prevented effectively, and at same time the safe and low resistance ohmic contact can be obtained in the base contact region. Also, the base contact impurity region having the higher concentration is not in contact with the emitter impurity region by forming the base contact impurity region spaced apart a predetermined interval from the emitter impurity region. Consequently, various inconveniences such as the decrease of the emitter-base breakdown voltage caused when the base contact impurity region of the higher concentration is in contact with the emitter impurity region.

Also, according to one manufacturing method of the semiconductor device of the present invention, the base contact impurity region having the second impurity concentration which is higher than the first impurity concentration is formed by introducing the second conductivity-type impurity onto the main surface of the base impurity region of the second conductivity-type having the first impurity concentration. Thus, even if the impurity in the base contact impurity region is taken in the metal silicide layer formed by formation of a silicide on the metal layer and the surface impurity concentration in the base contact impurity region is decreased, the conventional abrupt increase of the base contact resistance is effectively prevented. Thus, the decrease of operating speed of the semiconductor device is prevented. Also, the base contact impurity region having a high concentration is prevented from contacting the emitter impurity region by forming the base contact impurity region in the region spaced apart by a predetermined distance from the emitter impurity region, whereby various inconveniences such as the decrease of the emitter-base breakdown voltage caused by the contact of the base contact impurity region having a high concentration with the emitter impurity region can be prevented. Further, by forming the base contact impurity region to have the second depth shallower than the first depth of the emitter impurity region, the lateral spread of the base contact impurity region can be reduced. Thus, the side of the base contact impurity region having a high concentration can be effectively prevented from contacting the side of the emitter impurity region even when the elements are miniaturized according to high integration of the semiconductor device.

Further, according to another manufacturing method of the semiconductor device in the present invention, the metal layer is formed so as to contact the predetermined region on the main surface of the base impurity region, the second conductivity-type impurity is introduced into that metal layer, and the heat treatment is effected thereon. Then, by spreading the second conductivity-type impurity introduced into that metal layer over the surface of the base impurity region having the first impurity concentration, the base contact impurity region having the second impurity concentration higher than the first impurity concentration as well as the second depth shallower than the first depth is formed, and also a silicide of the metal layer is formed. Accordingly, the formation of the silicide of the metal layer and the formation of the base contact impurity region can be carried out in one process, so that its manufacturing process can be simplified. Also, since the base contact impurity region is formed by diffusing the impurity after introducing the impurity into the metal layer, the peak position of the impurity concentration can easily be controlled such that it is positioned in the vicinity of the interface between the metal layer and the base impurity region when the impurity is introduced in the metal layer. Thus, the surface impurity concentration in the base contact impurity region, which is formed by diffusing the impurity in the metal layer, can easily be made high, and the base contact impurity region can be formed much shallower.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a collector impurity region of a first conductivity-type;
   a base impurity region of a second conductivity-type having a first impurity concentration formed in a predetermined region on the main surface of said collector impurity region;

an emitter impurity region of the first conductivity-type having a first depth formed in a predetermined region on the main surface of said based impurity region; and a base contact impurity region of the second conductivity-type having a second impurity concentration higher than said first impurity concentration and a second depth shallower than said first depth formed on the main surface of said based impurity region spaced apart by a predetermined distance from said emitter impurity region, said base contact impurity region having a metal silicide layer formed thereon, said metal silicide layer including one metal silicide selected from the group consisting of $TiSi_x$, $HfSi_x$, $VSi_x$, $TaSi_x$, $MoSi_x$, and $WSi_x$.

2. The semiconductor device according to claim 1, wherein said second impurity concentration is at least about $1.0 \times 10^{19}$ cm$^{-3}$.

3. The semiconductor device according to claim 1, wherein said second depth is in the range from about 0.1 to about 0.4 μm.

4. The semiconductor device according to claim 1, wherein the first impurity concentration of said base impurity region is in the range from about $2 \times 10^{16}$ to about $8 \times 10^{16}$ cm$^{-3}$.

5. The semiconductor device according to claim 1, wherein the first depth of said emitter impurity region is in the range from about 0.2 to about 0.5 μm.

6. A semiconductor device, comprising:

a collector impurity region of a first conductivity-type;

a base impurity region of a second conductivity-type having a first impurity concentration formed in a predetermined region on the main surface of said collector impurity region;

an emitter impurity region of the first conductivity-type formed in a predetermined region on the main surface of said based impurity region;

a base contact impurity region of the second conductivity-type having a second impurity concentration higher than said first impurity concentration formed on the main surface of said base impurity region spaced apart a predetermined interval from said emitter impurity region, and a metal silicide layer formed at least on said base contact impurity region and including one metal silicide selected from the group consisting of $TiSi_x$, $HfSi_x$, $VSi_x$, $TaSi_x$, $MoSi_x$, $WSi_x$ and $FeSi_x$.

7. The semiconductor device according to claim 6, wherein said metal silicide is TiSix layer, and a TiN layer is formed on said TiSix layer.

8. The semiconductor device according to claim 7, wherein said $TiSi_x$ layer has a film thickness of the range from about 60 to about 100 nm, and said TiN layer has a film thickness of the range from about 30 to about 70 nm.

9. The semiconductor device according to claim 7, wherein said semiconductor device further comprises an aluminum interconnection layer formed on said TiN layer.

* * * * *